United States Patent
Tsukano et al.

(10) Patent No.: US 11,133,176 B2
(45) Date of Patent: Sep. 28, 2021

(54) SUBSTRATE PROCESSING METHOD, RECORDING MEDIUM AND SUBSTRATE PROCESSING SYSTEM

(71) Applicant: Tokyo Electron Limited, Tokyo (JP)

(72) Inventors: Kento Tsukano, Koshi (JP); Gentaro Goshi, Koshi (JP); Takuro Masuzumi, Koshi (JP); Hiromi Kiyose, Koshi (JP); Shogo Fukui, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/058,032

(22) Filed: Aug. 8, 2018

(65) Prior Publication Data
US 2019/0051519 A1 Feb. 14, 2019

(30) Foreign Application Priority Data

Aug. 9, 2017 (JP) .............................. JP2017-154574
May 16, 2018 (JP) .............................. JP2018-094906

(51) Int. Cl.
*H01L 21/02* (2006.01)
*H01L 21/67* (2006.01)
(Continued)

(52) U.S. Cl.
CPC ........ *H01L 21/02101* (2013.01); *B08B 3/041* (2013.01); *B08B 3/08* (2013.01); *B08B 3/10* (2013.01); *H01L 21/6719* (2013.01); *H01L 21/67028* (2013.01); *H01L 21/67034* (2013.01); *H01L 21/67051* (2013.01);
(Continued)

(58) Field of Classification Search
CPC ......... H01L 21/02101; H01L 21/67028; H01L 21/67034; H01L 21/67051; H01L 21/67126; H01L 21/6719; H01L 21/67748; H01L 21/68764; B08B 3/041; B08B 3/08; B08B 3/10
See application file for complete search history.

(56) References Cited

U.S. PATENT DOCUMENTS

2007/0113872 A1* 5/2007 Uchida ............. H01L 21/67057
134/26
2008/0063493 A1* 3/2008 Cho .................. H01L 21/67034
414/217
(Continued)

FOREIGN PATENT DOCUMENTS

JP 2013-012538 A 1/2013

*Primary Examiner* — Sharidan Carrillo
(74) *Attorney, Agent, or Firm* — Pearne & Gordon LLP

(57) ABSTRACT

In a substrate processing method, as a liquid film forming process, a liquid film of a processing liquid covering a surface of a substrate W is formed by supplying the processing liquid onto the surface of the substrate W while rotating the substrate W at a first rotation number. After the liquid film forming process, as a supply stopping process, a rotation number of the substrate W is set to be of a value equal to or less than the first rotation number and a supply of the processing liquid onto the substrate W is stopped. After the supply stopping process, as a liquid amount adjusting process, a liquid amount of the processing liquid forming the liquid film is reduced by setting the rotation number of the substrate W to a rotation number larger than the first rotation number.

6 Claims, 14 Drawing Sheets

(51) Int. Cl.
  *B08B 3/10* (2006.01)
  *B08B 3/04* (2006.01)
  *B08B 3/08* (2006.01)
  *H01L 21/687* (2006.01)
  *H01L 21/677* (2006.01)

(52) U.S. Cl.
  CPC .. *H01L 21/67126* (2013.01); *H01L 21/67748* (2013.01); *H01L 21/68764* (2013.01)

(56) References Cited

U.S. PATENT DOCUMENTS

| | | | |
|---|---|---|---|
| 2009/0032067 A1* | 2/2009 | Kojimaru | H01L 21/67028 134/26 |
| 2011/0220152 A1* | 9/2011 | Kitajima | F26B 3/00 134/26 |
| 2014/0093644 A1* | 4/2014 | Fujii | B05D 1/005 427/240 |
| 2015/0083167 A1* | 3/2015 | Yoshizumi | H01L 21/67051 134/26 |
| 2015/0279708 A1* | 10/2015 | Kobayashi | H01L 21/6704 438/747 |
| 2016/0045938 A1* | 2/2016 | Aomatsu | B08B 3/08 134/26 |
| 2016/0256901 A1* | 9/2016 | Kobayashi | B05B 1/005 |
| 2018/0200763 A1* | 7/2018 | Otsuji | B08B 3/10 |
| 2019/0051519 A1* | 2/2019 | Tsukano | H01L 21/68764 |

\* cited by examiner

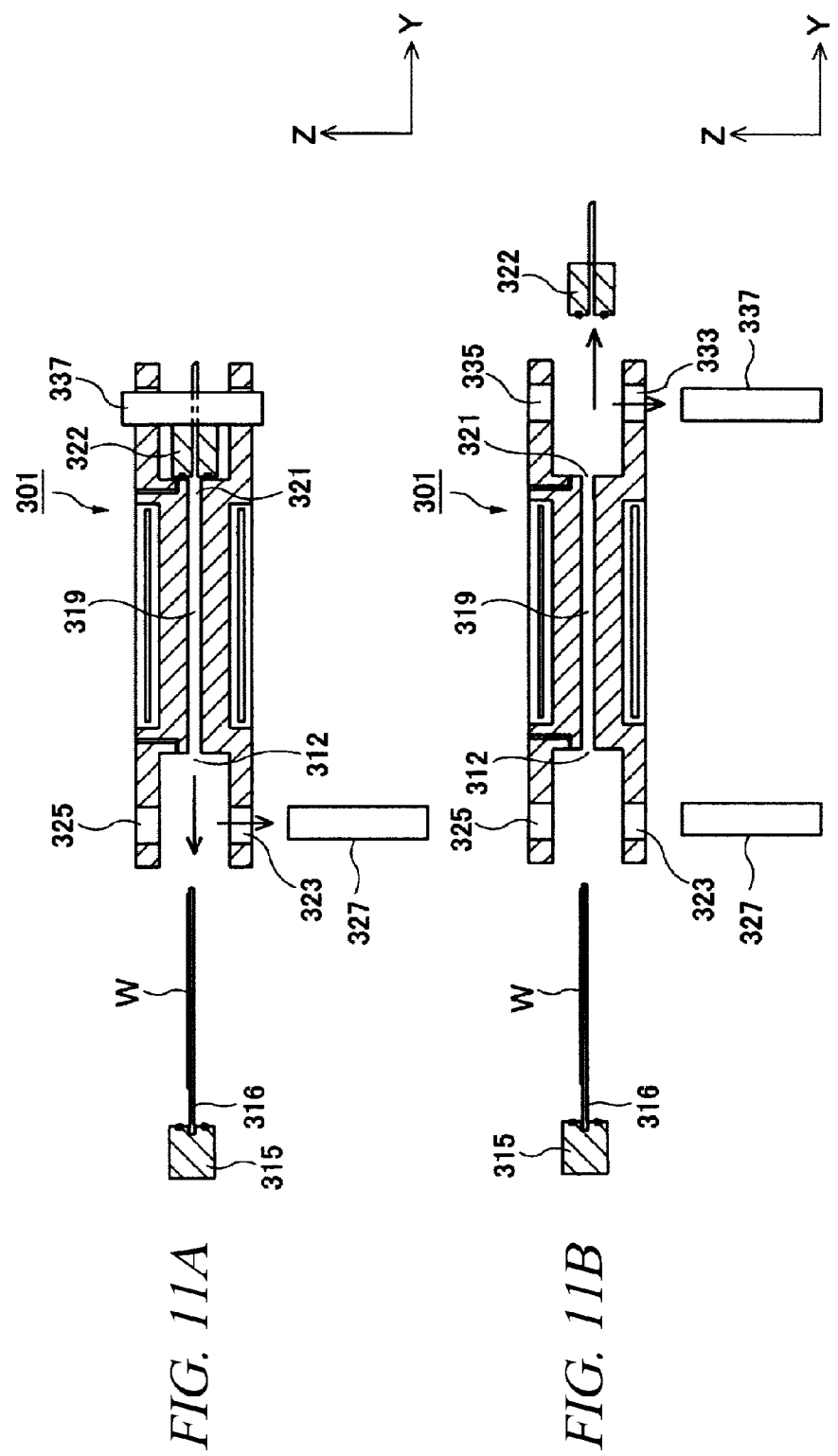

SUBSTRATE PROCESSING METHOD, RECORDING MEDIUM AND SUBSTRATE PROCESSING SYSTEM

CROSS-REFERENCE TO RELATED APPLICATION

This application claims the benefit of Japanese Patent Application Nos. 2017-154574 and 2018-094906 filed on Aug. 9, 2017 and May 16, 2018, respectively, the entire disclosures of which are incorporated herein by reference.

TECHNICAL FIELD

The embodiments described herein pertain generally to a substrate processing method, a recording medium and a substrate processing system.

BACKGROUND

In a semiconductor device manufacturing process of forming a stacked structure of integrated circuits on a surface of a semiconductor wafer (hereinafter, simply referred to as a wafer) as a substrate, there is performed a process of processing the surface of the wafer by using a liquid, for example, a process of removing a natural oxide film or a microscopic dirt on the surface of the wafer by using a cleaning liquid such as a chemical liquid.

To remove the liquid remaining on the surface of the wafer through such a process, there is known a method of using a processing fluid in a supercritical state. By way of example, Patent Document 1 discloses a substrate processing apparatus configured to dry the wafer by dissolving an organic solvent from the substrate (wafer) by using a supercritical fluid.

In the substrate processing apparatus of Patent Document 1, the surface of the wafer is cleaned within a processing apparatus by using a cleaning liquid such as a chemical liquid. An organic solvent as a processing liquid is accumulated on the surface of the wafer after being cleaned. The wafer having the organic solvent accumulated thereon is transferred from a cleaning apparatus into a supercritical processing apparatus, and a drying processing upon the wafer is performed within the supercritical processing apparatus by using the processing fluid of the supercritical state. In this way, by accumulating the organic solvent on the surface of the wafer, the surface of the wafer after being cleaned can be suppressed from being dried until the wafer is subjected to the drying processing within the supercritical processing apparatus. Therefore, particle generation is suppressed.

Patent Document 1: Japanese Patent Laid-open Publication No. 2013-012538

SUMMARY

If, however, the amount of the liquid accumulation of the organic solvent on the surface of the wafer after being cleaned is too small, the organic solvent may be vaporized before the drying processing is performed in the supercritical processing apparatus. On the other hand, if the amount of the liquid accumulation is too large, a particle may be generated at the wafer after the drying processing within the supercritical processing apparatus. For this reason, the organic solvent on the surface of the wafer after being cleaned is required to be accumulated in a required amount with high accuracy.

In view of the foregoing, exemplary embodiments provide a substrate processing method, a recording medium and a substrate processing system capable of improving accuracy of a thickness of a liquid film of a processing liquid formed on a surface of a substrate.

In one exemplary embodiment, a substrate processing method includes a liquid film forming process of forming, by supplying a processing liquid onto a surface of a substrate while rotating the substrate at a first rotation number, a liquid film of the processing liquid covering the surface of the substrate; a supply stopping process of setting, after the liquid film forming process, a rotation number of the substrate to be of a value equal to or less than the first rotation number and stopping a supply of the processing liquid onto the substrate; and a liquid amount adjusting process of reducing, after the supply stopping process, a liquid amount of the processing liquid forming the liquid film by setting the rotation number of the substrate to a rotation number larger than the first rotation number.

In another exemplary embodiment, there is provided a computer-readable recording medium having stored thereon computer-executable instructions that, in response to execution, cause a substrate processing system to perform a substrate processing method as described above.

In yet another exemplary embodiment, a substrate processing system includes a holding unit configured to hold a substrate horizontally; a rotation driving unit configured to rotate the holding unit; a processing liquid supply unit configured to supply a processing liquid onto the substrate held by the holding unit; and a control unit. The control unit controls the rotation driving unit and the processing liquid supply unit to perform a liquid film forming process of forming, by supplying the processing liquid onto a surface of the substrate while rotating the substrate at a first rotation number, a liquid film of the processing liquid covering the surface of the substrate; a supply stopping process of setting, after the liquid film forming process, a rotation number of the substrate to be of a value equal to or less than the first rotation number and stopping a supply of the processing liquid onto the substrate; and a liquid amount adjusting process of reducing, after the supply stopping process, a liquid amount of the processing liquid forming the liquid film by setting the rotation number of the substrate to a second rotation number larger than the first rotation number.

According to the exemplary embodiments, it is possible to improve the accuracy of the thickness of the liquid film of the processing liquid formed on the surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 11A and FIG. 11B are cross sectional views for describing a maintenance method for the processing vessel of the supercritical processing apparatus;

DETAILED DESCRIPTION

Figure 1:
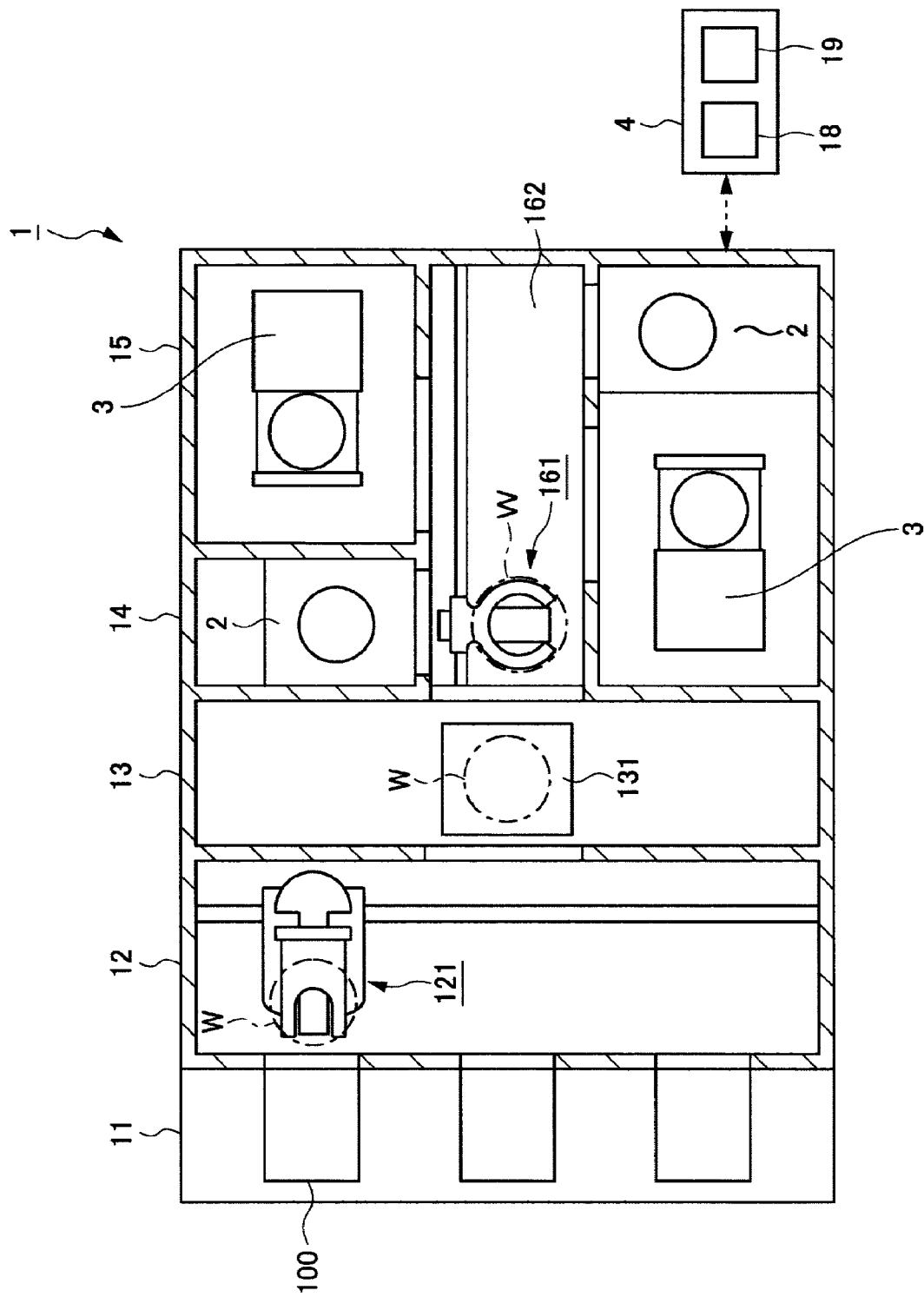
FIG. 1 is a transversal plan view of a substrate processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Exemplary Embodiment

Hereinafter, a substrate processing method, a recording medium and a substrate processing system according to an exemplary embodiment will be explained with reference to the accompanying drawings. Further, configurations shown in the accompanying drawings may include modifications of sizes and scales of some parts for the purposes of illustration and clear understanding.

[Configuration of Substrate Processing System]

As depicted in FIG. 1, a substrate processing system 1 is equipped with a plurality of cleaning apparatuses 2 (two cleaning apparatuses 2 in the example shown in FIG. 1) configured to perform a cleaning processing by supplying a cleaning liquid onto a wafer W; and a multiplicity of supercritical processing apparatuses 3 (two supercritical processing apparatuses 3 in the example shown in FIG. 1) configured to remove a drying-suppression processing liquid remaining on the wafer W after being cleaned (in the present exemplary embodiment, IPA (isopropyl alcohol) as an example of an organic solvent) by bringing it into contact with a processing fluid in a supercritical state (in the present exemplary embodiment, $CO_2$ (carbon dioxide)).

In this substrate processing system 1, a FOUP 100 is placed in a placing unit 11, and a wafer W accommodated in the FOUP 100 is delivered to a cleaning processing unit 14 and a supercritical processing unit 15 via a carry-in/out unit 12 and a delivery unit 13. In the cleaning processing unit 14 and the supercritical processing unit 15, the wafer W is first carried into the cleaning apparatus 2 provided in the cleaning processing unit 14 to be subjected to a cleaning processing, and, then, is carried into the supercritical processing apparatus 3 provided in the supercritical processing unit 15 to be subjected to a drying processing of removing IPA from the wafer W. In FIG. 1, a reference numeral 121 denotes a first transfer mechanism configured to transfer the wafer W between the FOUP 100 and the delivery unit 13, and a reference numeral 131 denotes a delivery shelf serving as a buffer in which the wafer W transferred between the carry-in/out unit 12 and the cleaning processing unit 14/the supercritical processing unit 15 is temporarily placed.

A wafer transfer path 162 is connected to an opening of the delivery unit 13, and the cleaning processing unit 14 and the supercritical processing unit 15 are provided along the wafer transfer path 162. In the cleaning processing unit 14, a total number of two cleaning apparatuses 2 are arranged with the wafer transfer path 162 therebetween, that is, one at each side of the wafer transfer path 162. Meanwhile, in the supercritical processing unit 15, a total number of two supercritical processing apparatuses 3 configured to perform the drying processing of removing the IPA from the wafer W are arranged with the wafer transfer path 162 therebetween, that is, one at each side of the wafer transfer path 162. A second transfer mechanism 161 is provided in the wafer transfer path 162, and the second transfer mechanism 161 is configured to be movable within the wafer transfer path 162. The wafer W placed in the delivery shelf 131 is received by the second transfer mechanism 161, and the second transfer mechanism 161 carries the wafer W into the cleaning apparatus 2 and the supercritical processing apparatus 3. Further, the numbers of the cleaning apparatuses 2 and the supercritical processing apparatuses 3 and the arrangements thereof are not particularly limited. Depending on the number of wafers W processed per unit time, a processing time of each cleaning apparatus 2, and a processing time of each supercritical processing apparatus 3, and so forth, appropriate numbers of the cleaning apparatuses 2 and the supercritical processing apparatuses 3 are appropriately arranged.

Figure 2:
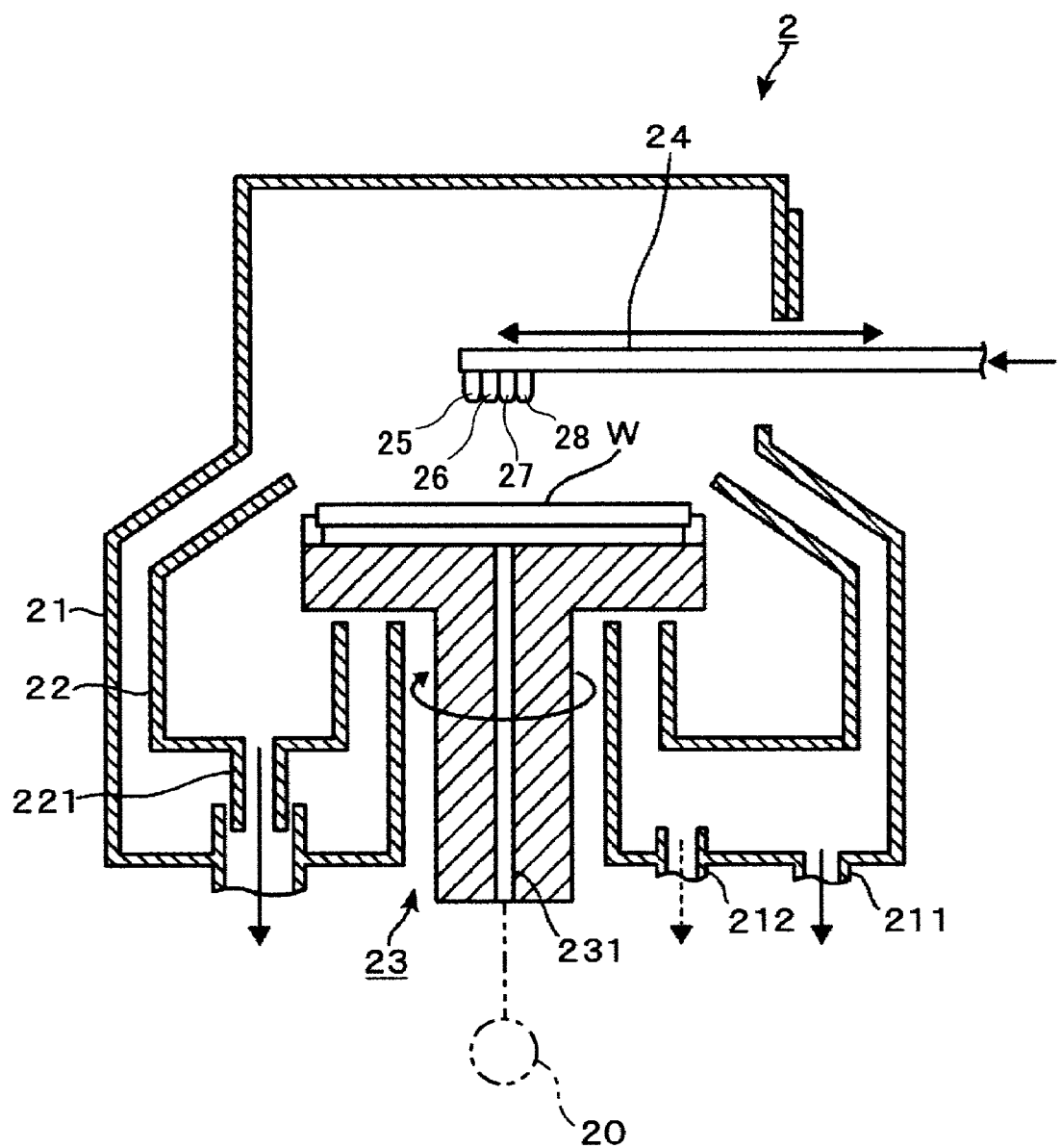
FIG. 2 is a longitudinal sectional view of a cleaning apparatus provided in the substrate processing system shown in FIG. 1.

As depicted in FIG. 2, the cleaning apparatus 2 is configured as a single-wafer apparatus configured to clean wafers W one by one by, for example, spin cleaning. That is, as illustrated in a longitudinal sectional view of FIG. 2, the wafer W is held substantially horizontally by a wafer holding mechanism 23 (holding unit) provided within an outer chamber 21 which forms a processing space. By rotating this wafer holding mechanism 23 around the vertical axis through a motor 20 (rotation driving unit), the wafer W is rotated. Cleaning of the wafer W is performed by advancing a nozzle arm 24 to above the wafer W being rotated W and supplying a chemical liquid for cleaning, a rinse liquid and the IPA onto a processing target surface of the wafer W at appropriate timings from respective nozzles 25 to 28 provided at a leading end of the nozzle arm 24. Further, a chemical liquid supply path 231 is formed within the wafer holding mechanism 23, and a rear surface of the wafer W is also cleaned by the chemical liquid and the rinse liquid supplied from this chemical liquid supply path 231.

The first chemical liquid nozzle 25, the second chemical liquid nozzle 26, the rinse liquid nozzle 27 and the IPA nozzle 28 are provided at the leading end of the nozzle arm 24.

The first chemical liquid nozzle 25 supplies a SC1 liquid (a mixed liquid of ammonia and hydrogen peroxide) as an alkaline chemical liquid onto the wafer W. This SC1 liquid is a chemical liquid for removing a particle or an organic contaminant from the wafer W. Though not shown, the first chemical liquid nozzle 25 is connected to a first chemical liquid supply source via a first chemical liquid supply line, and the first chemical liquid supply line is equipped with a first chemical liquid opening/closing valve. By opening the first chemical liquid opening/closing valve, the SC1 is supplied to the first chemical liquid nozzle 25 from the first chemical liquid supply source.

The second chemical liquid nozzle 26 supplies DHF (Diluted Hydrofluoric acid) as an acidic chemical liquid onto the wafer W. This DHF is a chemical liquid for removing a natural oxide film formed on the surface of the wafer W. Though not shown, the second chemical liquid nozzle 26 is connected to a second chemical liquid supply source via a second chemical liquid supply line, and the second chemical liquid supply line is equipped with a second chemical liquid opening/closing valve. By opening this second chemical liquid opening/closing valve, the DHF is supplied to the second chemical liquid nozzle 26 from the second chemical liquid supply source.

The rinse liquid nozzle 27 supplies DIW (Deionized Water) as a rinse liquid onto the wafer W. This DIW is a liquid for washing the SC1 liquid or the DHF away from the wafer W. Though not shown, the rinse liquid nozzle 27 is connected to a rinse liquid supply source via a rinse liquid supply line, and the rinse liquid supply line is equipped with a rinse liquid opening/closing valve. By opening this rinse liquid opening/closing valve, the DIW is supplied to the rinse liquid nozzle 27 from the rinse liquid supply source.

Figure 3:
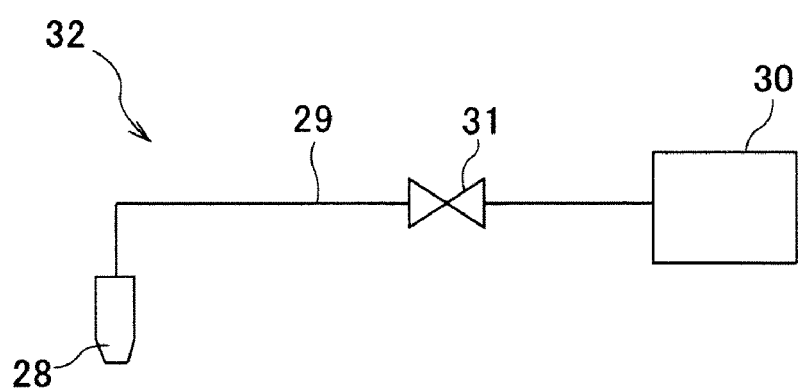
FIG. 3 is a diagram illustrating an IPA supply system in the cleaning apparatus of FIG. 1.

The IPA nozzle 28 supplies IPA as a drying-suppression processing liquid onto the wafer W. The IPA is a processing liquid for suppressing the wafer W from getting dry. Particularly, the supply of the IPA onto the wafer W aims at suppressing the wafer W from being dried during a transfer of the wafer W from the cleaning apparatus 2 to the supercritical processing apparatus 3. Further, to suppress a so-called pattern collapse on the wafer W due to vaporization of the IPA during the transfer, the IPA is accumulated on the surface of the wafer W such that a liquid film of the IPA having a relatively large thickness is formed on the surface of the wafer W. The IPA nozzle 28 is connected to, as shown in FIG. 3, an IPA supply source 30 via an IPA supply line 29, and the IPA supply line 29 is equipped with an IPA opening/closing valve 31. By opening this IPA opening/closing valve 31, the IPA is supplied to the IPA nozzle 28 from the IPA supply source 30. The IPA nozzle 28, the IPA supply line 29, the IPA supply source 30 and the IPA opening/closing valve 31 constitute an IPA supply unit 32 (processing liquid supply unit).

Here, the chemical liquids used to clean the wafer W are not limited to the SC1 liquid and the DHF, and any of various other chemical liquids may be used. Further, instead of providing the rinse liquid nozzle 27 at the nozzle arm 24, there may be adopted a configuration in which the DIW can be selectively discharged from the first chemical liquid nozzle 25 and the second chemical liquid nozzle 26.

These chemical liquids, the DIW and the IPA are received by an inner cup 22 provided within the outer chamber 21 and the outer chamber 21 itself to be drained from liquid drain port 221 and 211, as illustrated in FIG. 2. Further, an atmosphere within the outer chamber 21 is exhausted through a gas exhaust port 212.

The wafer W carried out of the cleaning apparatus 2 is carried into a processing vessel 301 of the supercritical processing apparatus 3 by the second transfer mechanism 161 shown in FIG. 1 in the state that the IPA is accumulated on the wafer W. Then, a drying processing for the IPA is performed in the supercritical processing apparatus 3.

[Supercritical Processing Apparatus]

Now, details of the drying processing performed in the supercritical processing apparatus 3 by using a supercritical fluid will be explained. First, a configuration example of the processing vessel of the supercritical processing apparatus 3 into which the wafer W is carried will be described.

Figure 4:
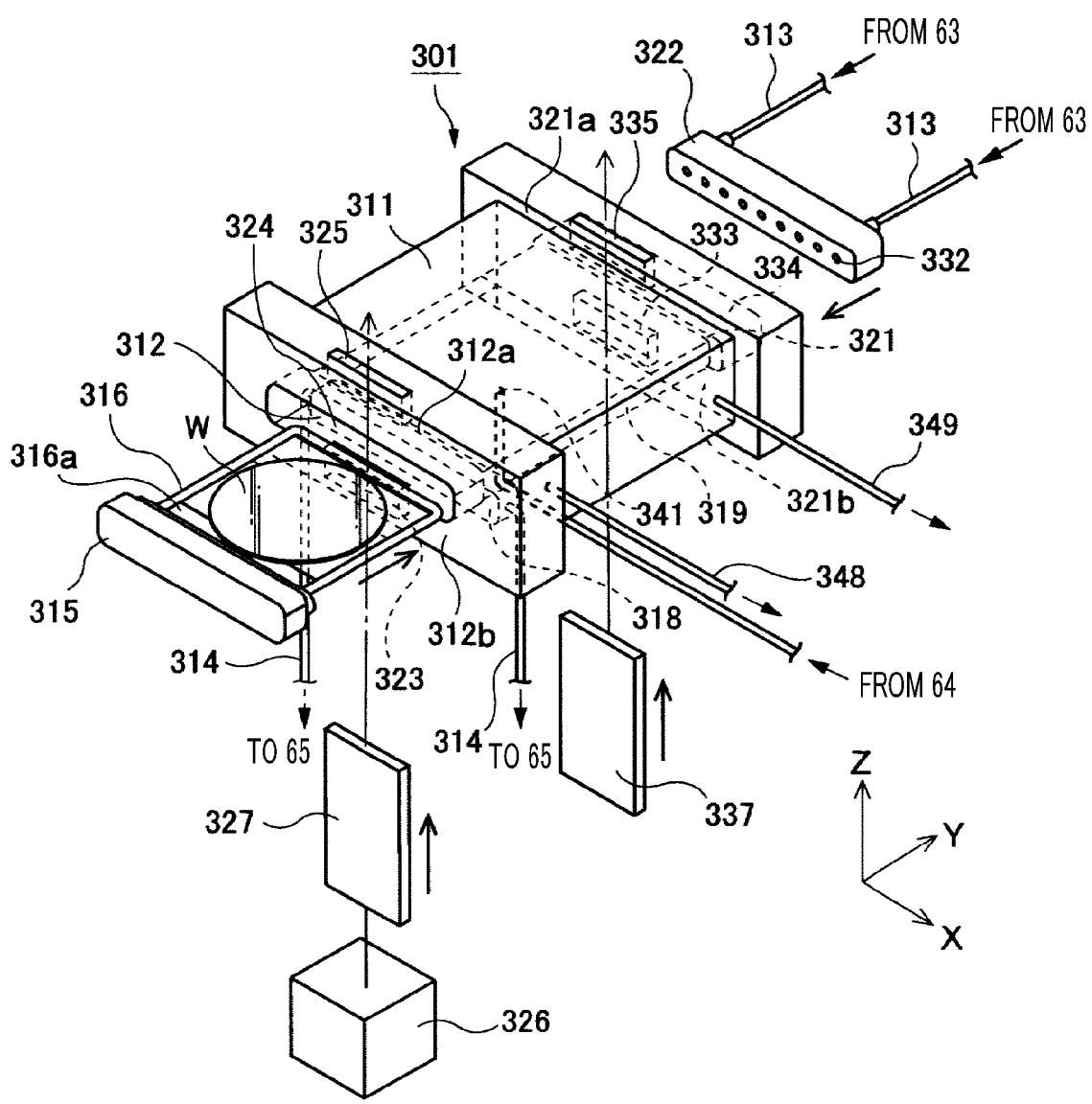
FIG. 4 is an exterior perspective view of a processing vessel of a supercritical processing apparatus.
Figure 5:
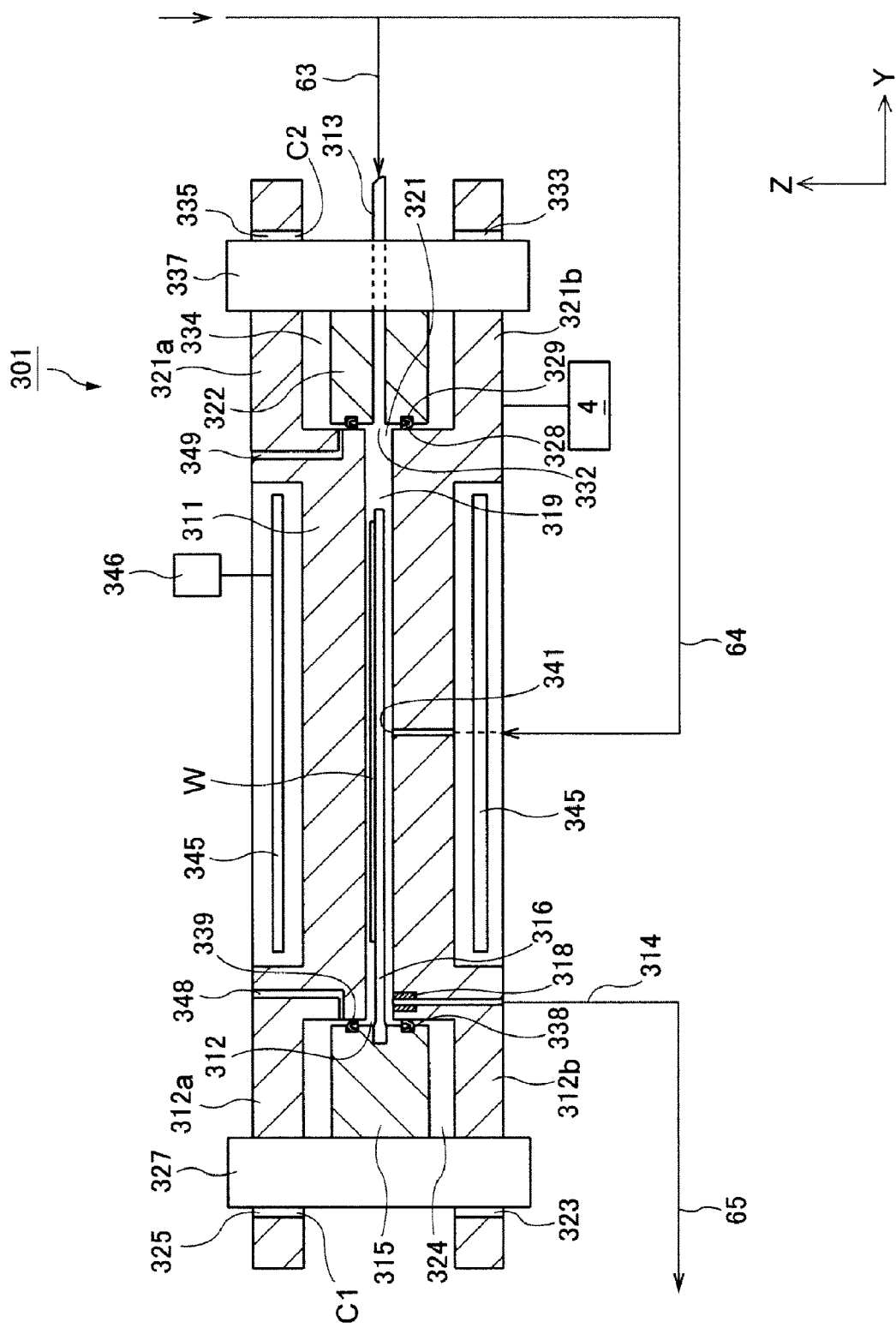
FIG. 5 is a cross sectional view illustrating an example of the processing vessel shown in FIG. 4.

FIG. 4 is an exterior perspective view illustrating an example of the processing vessel 301 of the supercritical processing apparatus 3, and FIG. 5 is a cross sectional view illustrating an example of the processing vessel 301.

The processing vessel 301 is configured to accommodate the wafer W therein and perform a processing upon the wafer W by using a high-pressure processing fluid such as a supercritical fluid. As shown in FIG. 4 and FIG. 5, this processing vessel 301 includes: a vessel main body 311 which has a housing shape and is configured to accommodate the wafer W therein; a transfer opening 312 through which the wafer W is carried into/out of the vessel main body 311; a holding plate 316 configured to hold the wafer W as a processing target; and a first cover member 315 configured to support the holding plate 316 and seal the transfer opening 312 when the wafer W is loaded in the vessel main body 311. Further, an opening 321 for maintenance (maintenance opening) is provided at a position of the vessel main body 311 different from where the transfer opening 312 is provided. This maintenance opening 321 is kept closed by a second cover member 322 except when maintenance is performed or the like.

The vessel main body 311 is configured to accommodate the wafer W therein and perform the processing upon the wafer W by using the processing fluid. The vessel main body 311 is a receptacle having a processing space 319 formed therein. For example, a wafer W having a diameter of 300 mm can be accommodated in the processing space 319. The aforementioned transfer opening 312 and maintenance opening 321 (for example, having the same shape and size as the transfer opening 312) are formed at two opposite ends of the processing space 319 and communicate with the processing space 319.

Further, a discharge port 314 is provided at a wall portion of the vessel main body 311 at the side of the transfer opening 312. The discharge port 314 is connected to a discharge side supply line 65 (see FIG. 7) which is provided at a downstream of the processing vessel 301 and through which the processing fluid is flown. Further, though two discharge ports 314 are shown in FIG. 4, the number of the discharge ports 314 is not particularly limited.

A first upper block 312a and a first lower block 312b are provided above and under the transfer opening 312 respectively. The first upper block 312a and the first lower block 312b are provided with an insertion hole 325 and an insertion hole 323 respectively for allowing a first lock plate 327 to be described later to be inserted therethrough. The insertion holes 325 and 323 are formed through the first upper block 312a and the first lower block 312b respectively in the vertical direction (a direction perpendicular to the surface of the wafer W).

The holding plate 316 is a thin plate-shaped member configured to be placed within the processing space 319 of the vessel main body 311 horizontally while holding the wafer W thereon. The holding plate 316 is connected with the first cover member 315. Further, the holding plate 316 is provided with a discharge opening 316a at the side of the first cover member 315.

A first cover member accommodation space 324 is formed in a front region (−Y direction) of the vessel main body 311. The first cover member 315 is accommodated in this first cover member accommodation space 324 when the holding plate 316 is carried into the processing vessel 301 and a supercritical processing is performed on the wafer W. In this case, the first cover member 315 closes the transfer opening 312 and hermetically seals the processing space 319.

The first lock plate 327 is provided at a front side of the processing vessel 301. This first lock plate 327 serves as a restrict member which restricts a movement of the first cover member 315 that might be caused by a pressure within the vessel main body 311 when the holding plate 316 is moved up to a processing position. This first lock plate 327 is inserted into the insertion hole 323 of the first lower block 312b and the insertion hole 325 of the first upper block 312a. At this time, since the first lock plate 327 serves as a latch, movements of the first cover member 315 and the holding plate 316 in the forward-backward direction (Y direction in FIG. 4 and FIG. 5) are restricted. The first lock plate 327 is vertically moved by an elevating mechanism 326 between a lock position where the first lock plate 327 is inserted into the insertion holes 323 and 325 and presses the first cover member 315 and an opening position where the first lock plate 327 is retreated downwards from the lock position and opens the first cover member 315. In this example, the first lock plate 327, the insertion holes 323 and 325 and the elevating mechanism 326 constitute a confining mechanism configured to restrict the movement of the first cover member 315 that might be caused by the pressure within the vessel main body 311. Further, since each of the insertion holes 323 and 325 has a margin for allowing the first lock plate 327 to be inserted therein or removed therefrom, there exists a slight gap C1 (see FIG. 5) between the insertion holes 323 and 325 and the first lock plate 327 located at the lock position. Further, for the convenience of illustration, the gap C1 is exaggerated in FIG. 5.

The maintenance opening 321 is provided at a wall surface of the vessel main body 311, facing the transfer opening 312. As the maintenance opening 321 and the transfer opening 312 face each other, the pressure of the processing space 319 is applied to an inner surface of the vessel main body 311 in a substantially uniform manner when the vessel main body 311 is sealed by the first cover member 315 and the second cover member 322. Therefore, concentration of a stress to a certain position of the vessel main body 311 is suppressed. However, the maintenance opening 321 may be provided at a position other than the facing position to the transfer opening 312. For example, the maintenance opening 321 may be provided at a side wall surface with respect to an advancing direction (Y direction) of the wafer W.

A second upper block 321a and a second lower block 321b are provided above and under the maintenance opening 321 respectively. The second upper block 321a and the second lower block 321b are provided with an insertion hole 335 and an insertion hole 333 respectively for allowing a second lock plate 337 to be inserted therethrough. The insertion holes 335 and 333 are formed through the second upper block 321a and the second lower block 321b respectively in the vertical direction (the direction perpendicular to the surface of the wafer W, that is, the Z direction).

A second cover member accommodation space 334 is formed in a rear region (+Y direction) of the vessel main body 311. The second cover member 322 is accommodated in this second cover member accommodation space 334 except when the maintenance is performed, and closes the maintenance opening 321. Further, the second cover member 322 is provided with a supply port 313. The supply port 313 is provided at an upstream of the processing vessel 301 and is connected with a first supply line 63 (see FIG. 7) through which the processing fluid is flown. In FIG. 4, though two supply ports 313 are illustrated, the number of the supply ports 313 is not particularly limited.

The second lock plate 337 serves as a restrict member which restricts a movement of the second cover member 322 that might be caused by the pressure within the vessel main body 311. This second lock plate 337 is inserted into the insertion holes 333 and 335 around the maintenance hole 321. At this time, since the second lock plate 337 serves as a latch, a movement of the second cover member 322 in the forward-backward direction (Y direction) is restricted. The second lock plate 337 is configured to be vertically moved between a lock position where the second lock plate 337 is inserted into the insertion holes 333 and 335 and presses the second cover member 322 and an opening position where the second lock plate 337 is retreated downwards from the lock position and opens the second cover member 322. In the present exemplary embodiment, though the second lock plate 337 is moved manually, it may be also possible to move it automatically by providing the substantially same elevating mechanism as the elevating mechanism 326. Further, since each of the insertion holes 333 and 335 has a margin for allowing the second lock plate 337 to be inserted therein or removed therefrom, there exists a slight gap C2 (see FIG. 5) between the insertion holes 333 and 335 and the second lock plate 337 located at the lock position. Further, for the convenience of illustration, the gap C2 is exaggerated in FIG. 5.

In the present exemplary embodiment, the second cover member 322 is connected to the first supply line 63, and the second cover member 322 is provided with a multiple number of openings 332. The second cover member 322 serves as a fluid supply header which supplies the processing fluid introduced from the first supply line 63 via the supply port 313 into the vessel main body 311. Accordingly, when the second cover member 322 is separated for maintenance, a maintenance work of cleaning the openings 332 or the like may be carried out easily. Furthermore, a fluid discharge header 318 is provided at a wall portion of the vessel main body 311 at the side of the transfer opening 312 to communicate with the discharge port 314. This fluid discharge header 318 is also provided with a multiple number of openings.

The second cover member 322 and the fluid discharge header 318 are configured to face each other. The second cover member 322 serving as the fluid supply unit supplies the processing fluid into the vessel main body 311 substantially in the horizontal direction. Here, the horizontal direction refers to a direction perpendicular to the vertical direction in which gravity works, and is typically parallel to a direction in which a flat surface of the wafer W held by the holding plate 316 is extended. The fluid discharge header 318 serving as a fluid discharge unit configured to discharge a fluid within the vessel main body 311 guides and discharges the fluid within the vessel main body 311 to the outside of the vessel main body 311 through the discharge opening 316a provided at the holding plate 316. The fluid discharged to the outside of the vessel main body 311 through the fluid discharge header 318 includes not only the processing fluid supplied into the vessel main body 311 via the second cover member 322 but also the IPA dissolved in the processing fluid from the surface of the wafer W. As stated, by supplying the processing fluid into the vessel main body 311 from the openings 332 of the second cover member 322 and by discharging the fluid from the vessel main body 311 through the openings of the fluid discharge header 318, a laminar flow of the processing fluid, which flows substantially in parallel with the surface of the wafer W, is formed within the vessel main body 311.

Furthermore, vacuum suction pipes 348 and 349 are connected to a lateral surface of the vessel main body 311 at the side of the transfer opening 312 and a lateral surface of the vessel main body 311 at the side of the maintenance opening 321, respectively. The vacuum suction pipes 348 and 349 communicate with a surface of the vessel main body 311 at the side of the first cover member accommodation space 324 and a surface of the vessel main body 311 at the side of the second cover member accommodation space 334 respectively. The vacuum suction pipes 348 and 349 serve to attract the first cover member 315 and the second cover member 322 toward the vessel main body 311 by a vacuum suction force, respectively.

In addition, a bottom side fluid supply unit 341 is provided at a bottom surface of the vessel main body 311 to supply the processing fluid into the vessel main body 311. The bottom side fluid supply unit 341 is connected to a second supply line 64 (see FIG. 7) through which the processing fluid is supplied into the vessel main body 311. The bottom side fluid supply unit 341 supplies the processing fluid into the vessel main body 311 substantially upwards from the lower side. The processing fluid supplied from the bottom side fluid supply unit 341 flows from the rear surface of the wafer W to the front surface of the wafer W through the discharge opening 316a provided at the holding plate 316, and is discharged from the fluid discharge header 318 through the discharge opening 316a of the holding plate 316 along with the processing fluid from the second cover member 322. As for the position of the bottom side fluid supply unit 341, it may be desirable to locate the bottom side fluid supply unit 341 under the wafer W loaded in the vessel main body 311, and, more desirably, under a central portion of the wafer W. With this configuration, the processing fluid from the bottom side fluid supply unit 341 is made to reach the front surface of the wafer W uniformly.

As depicted in FIG. 5, a heater 345 composed of a resistance heating element such as, but not limited to, a tape heater is provided at each of an upper and a lower surface of the vessel main body 311. The heater 345 is connected with a power supply 346 and is capable of maintaining a temperature of the vessel main body 311 and a temperature of the processing space 319 within a range from, e.g., 100° C. to 300° C. by controlling an output of the power supply 346.

Figure 6A:
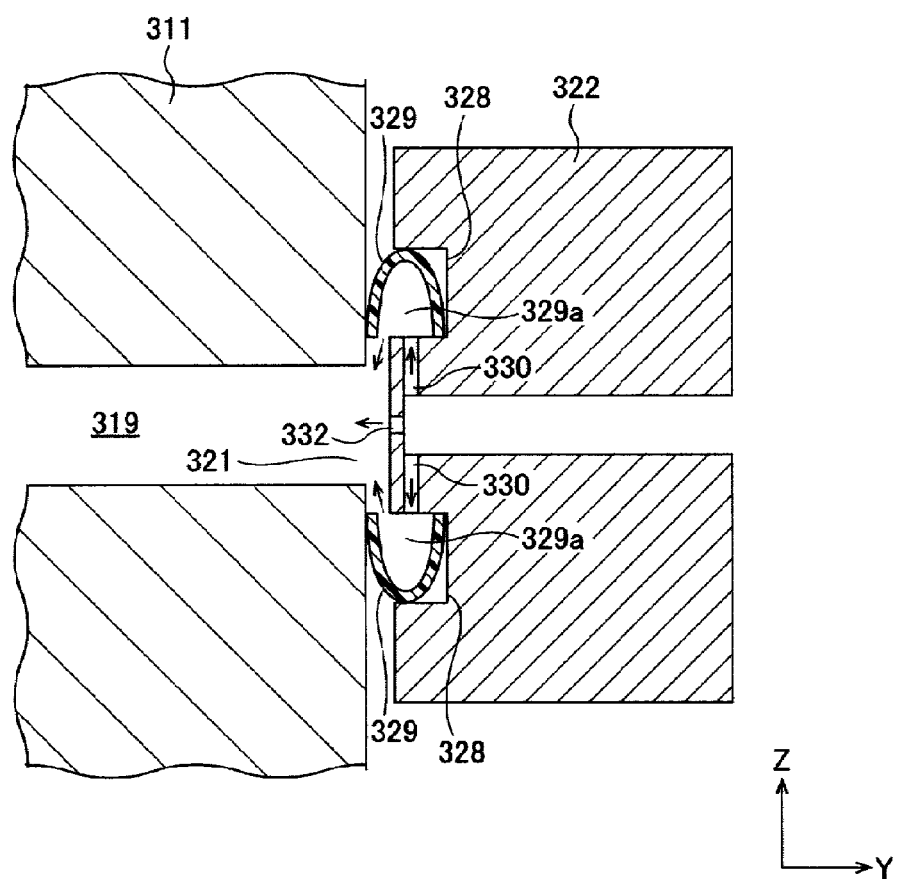
FIG. 6A is a cross sectional view illustrating the vicinity of an opening for maintenance of the processing vessel shown in FIG. 5.
Figure 6B:
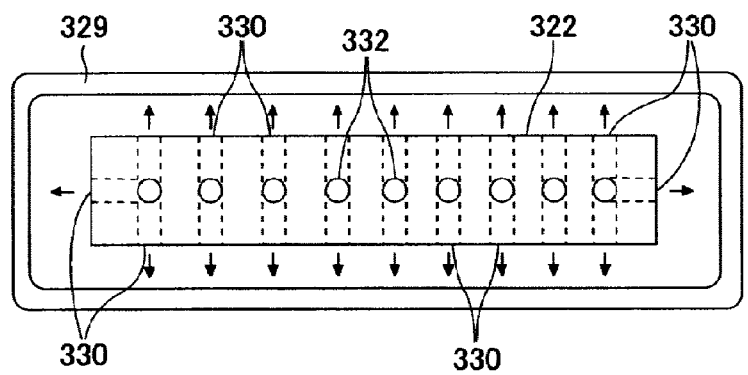
FIG. 6B is a diagram illustrating a surface of a second cover member of FIG. 6A at a vessel main body side.

Now, referring to FIG. 6A and FIG. 6B, the configuration in the vicinity of the maintenance opening 321 will be further explained.

As depicted in FIG. 6A, a recess 328 is formed at a sidewall of the second cover member 322 at the side of the processing space 319 to surround a position corresponding to an edge of the maintenance opening 321. By fitting a seal member 329 into this recess 328, the seal member 329 is disposed on the sidewall surface of the second cover member 322 which is in contact with a sidewall surface around the maintenance opening 321.

The seal member 329 is formed to have a ring shape to surround the maintenance opening 321. Further, the seal member 329 is formed to have a U-shaped cross section. In case of the seal member 329 shown in FIG. 6A, a U-shaped opening 329a is formed along an inner peripheral surface of the seal member 329 having the ring shape. That is to say, the seal member 329 has an inner space surrounded by the U-shape.

By closing the region in the vicinity of the maintenance opening 321 by using the second cover member 322 provided with the seal member 329, the seal member 329 is placed between the second cover member 322 and the vessel main body 311 to close a gap between the second cover member 322 and the vessel main body 311. Since this gap is formed around the maintenance opening 321 within the vessel main body 311, the opening 329a formed along the inner peripheral surface of the seal member 329 communicates with the processing space 319.

The seal member 329 having the opening 329a communicating with the processing space 319 is exposed to an atmosphere of the processing fluid. As a result, a component such as a resin or rubber or impurities contained therein may be eluted into the processing fluid. In view of this, at least an inner side of the opening 329a of the seal member 329 facing the processing space 319 is made of a resin having corrosion resistance against the liquid IPA or the processing fluid. An example of this resin may include polyimide, polyethylene, polypropylene, para-xylene, polyetheretherketone (PEEK), or the like. It is desirable to use a non-fluorine based resin which has little influence upon the semiconductor device even if a slight amount thereof is eluted into the processing fluid. Further, appropriately, a spring (not shown) made of a metal is provided at an inner surface (a surface in contact with the opening 329a) of the U-shaped seal member 329. This spring is configured to apply a spring force in a direction in which the seal member 329 is expanded outwards (that is, a direction in which the opening 329a is expanded).

If the processing fluid enters the opening 329a, there is generated a force which expands the seal member 329 from the opening 329a and presses an outer peripheral surface (a surface opposite to the opening 329a) of the seal member 329 toward the surface of the second cover member 322 at the side of the recess 328 and the sidewall surface of the vessel main body 311. Accordingly, the outer peripheral surface of the seal member 329 comes into firm contact with the second cover member 322 and the vessel main body 311, so that the gap between the second cover member 322 and the vessel main body 311 is hermetically sealed. This kind of seal member 329 has elasticity so that it can be transformed by the force received from the processing fluid, and is capable of maintaining the hermetical sealing of the gap against a pressure difference (e.g., 16 MPa to 20 MPa) between the processing space 319 and the outside thereof. Further, as stated above, in case that the metal spring is provided at the inner surface of the seal member 329, the force pressing the outer peripheral surface (the surface opposite to the opening 329a) of the seal member 329 toward the surface of the second cover member 322 at the side of the recess 328 and the sidewall surface of the vessel main body 311 is increased by the spring force, so that airtightness can be improved.

As shown in FIG. 6A and FIG. 6B, the second cover member 322 is provided with a multiple number of additional openings 330. Through these additional openings 330, the processing fluid supplied from the first supply line 63 via the supply port 313 is introduced into the opening 329a of the seal member 329. Each of the additional openings 330 is provided for each corresponding one of the openings 332 provided at the second cover member 322, and a part of the processing fluid flowing toward the opening 332 is extracted and supplied into the opening 329a of the seal member 329 through the additional opening 330 corresponding to the opening 332. Furthermore, as depicted in FIG. 6B, it is desirable that the additional openings 330 are also provided at a lateral side of the second cover member 322. In this configuration, the processing fluid is supplied to a portion of the opening 329a of the seal member 329 at a lateral side of the maintenance opening 321 as well.

Further, in the present exemplary embodiment, the transfer opening 312 of the vessel main body 311 is sealed by the first cover member 315 in the same manner as the maintenance opening 321.

That is, as depicted in FIG. 5, a recess 338 is formed at a sidewall of the first cover member 315 at the side of the processing space 319 to surround a position corresponding to an edge of the transfer opening 312. By fitting a seal member 339 into this recess 338, the seal member 339 is disposed on a sidewall surface of the first cover member 315 which is in contact with a sidewall surface around the transfer opening 312.

The seal member 339 is formed to have a ring shape to surround the transfer opening 312. Further, the seal member 339 is formed to have a U-shaped cross section. In this way, by closing the transfer opening 312 with the first cover member 315 which is provided with the seal member 339, the seal member 339 is placed between the first cover member 315 and the vessel main body 311 to seal a gap between the first cover member 315 and the transfer opening 312. Except this, the configuration for closing the transfer opening 312 by using the first cover member 315 and the seal member 339 is the approximately same as the above-described configuration for closing the maintenance opening 321.

[Configuration of Entire System of Supercritical Processing Apparatus]

Figure 7:
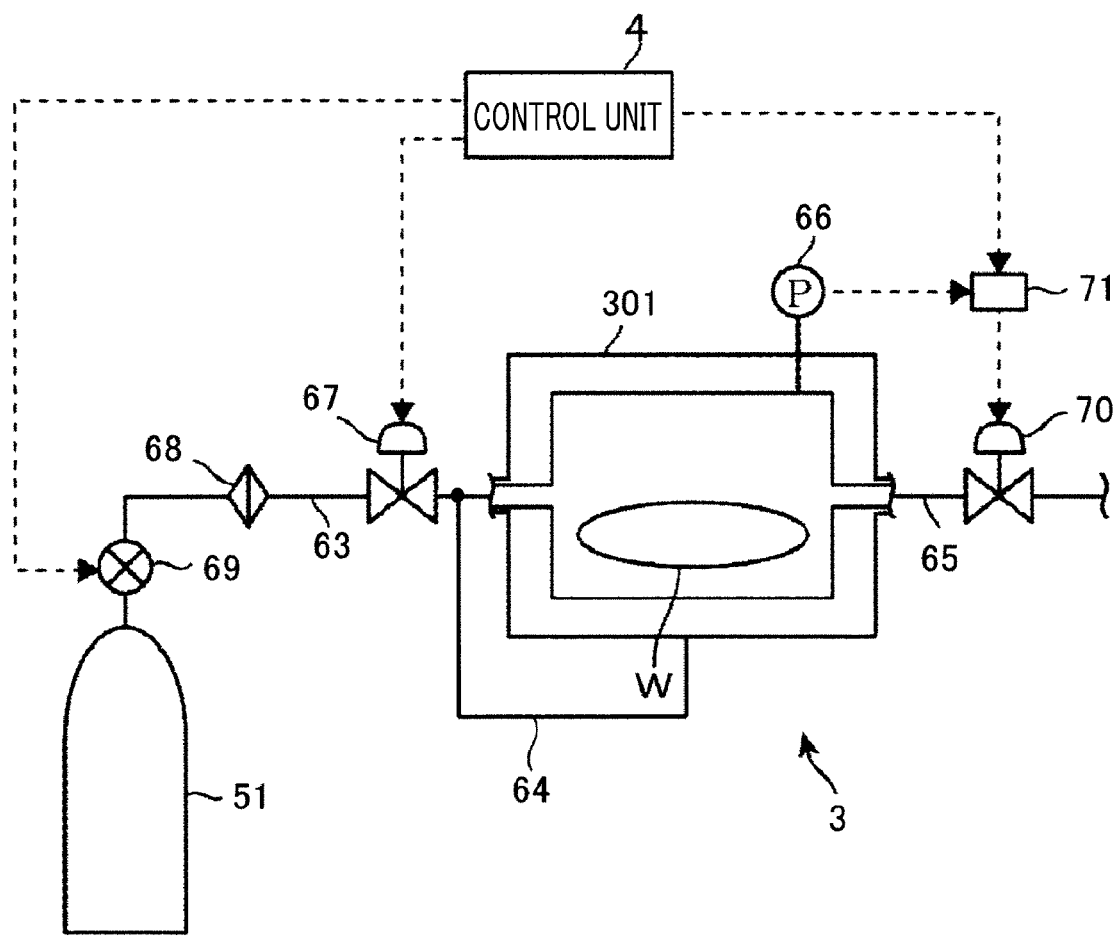
FIG. 7 is a block diagram illustrating the supercritical processing apparatus according to the first exemplary embodiment.

FIG. 7 is a diagram illustrating a configuration example of an entire system of the supercritical processing apparatus 3.

As depicted in FIG. 4, FIG. 5 and FIG. 7, the first supply line 63 for supplying the processing fluid into the processing vessel 301 is connected to the second cover member 322. Further, a second supply line 64 for supplying the processing fluid into the processing vessel 301 is connected to a wall portion of the vessel main body 311. This second supply line 64 is branched from the first supply line 63 at a downstream of an opening/closing valve 67. Furthermore, the discharge side supply line 65 for discharging the fluid within the processing vessel 301 is connected to a bottom portion of the vessel main body 311.

The first supply line 63 connected to the processing vessel 301 is coupled to a fluid supply tank 51 via the opening/closing valve 67 configured to be opened/closed to start or stop a supply of the high-pressure fluid into the processing vessel 301, a filter 68 and a flow rate control valve 69. The fluid supply tank 51 is equipped with, by way of example, a $CO_2$ cylinder configured to store therein liquid $CO_2$; and a booster pump composed of a syringe pump, a diaphragm pump or the like and configured to increase a pressure of the liquid $CO_2$ supplied from the $CO_2$ cylinder into the supercritical state. In FIG. 7, the $CO_2$ cylinder and the booster pump are illustrated to have a cylinder shape as a whole.

A flow rate of the supercritical $CO_2$ supplied from the fluid supply tank 51 is adjusted by a flow rate control valve 69, and the supercritical $CO_2$ with the controlled flow rate is then supplied into the processing vessel 301. This flow rate control valve 69 is composed of, by way of example, a needle valve or the like, and also serves as a stopping unit configured to stop the supply of the supercritical $CO_2$ from the fluid supply tank 51.

Further, a decompression valve 70 of the discharge side supply line 65 is connected to a pressure controller 71, and this pressure controller 71 has a feedback control function of adjusting opening degree based on a comparison result of a measurement result of the pressure within the processing vessel 301 obtained by a pressure gauge 66 provided in the processing vessel 301 and a predetermined set pressure.

The substrate processing system 1, the cleaning apparatus 2 and the supercritical processing apparatus 3 having the above-described configurations are connected to a control unit 4 as shown in FIG. 1 and FIG. 7. The control unit 4 is implemented by, for example, a computer and is equipped with an operation unit 18 and a storage unit 19 which are not illustrated. The storage unit 19 stores therein programs for controlling various kinds of processings performed in the substrate processing system 1. The operation unit 18 controls an operation of the substrate processing system 1 by reading and executing the programs stored in the storage unit 19. These programs are stored in a computer-readable recording medium and may be installed to the storage unit 19 of the control unit 4 from the recording medium. The computer-readable recording medium includes, by way of non-limiting example, a hard disk (HD), a flexible disk (FD), a compact disk (CD), a magnet optical disk (MO), a memory card, and so forth.

Particularly, the control unit 4 has a function of outputting, to the supercritical processing apparatus 3, a control signal to avoid a rapid change in the pressure (decrease change) from the first supply line 63 toward the processing vessel 301 by decompressing the processing vessel 301 and the first supply line 63 together before taking out the wafer W obtained after the processing thereof is completed. From this point of view, as illustrated in FIG. 7, the control unit 4 is electrically connected with the pressure controller 71 configured to adjust the opening degree of the decompression valve 70 provided at the discharge side supply line 65 and with the opening/closing valve 67 at the side of the first supply line 63 and the flow rate control valve 69.

Now, an operation according to the present exemplary embodiment having the above-described configuration, that is, a processing method for the wafer W (substrate processing method) in the substrate processing system 1 according to the present exemplary embodiment will be explained.

[Cleaning Process]

Here, a cleaning method for the wafer W in the cleaning apparatus 2 will be first discussed.

<First Chemical Liquid Cleaning Process>

First, the wafer W is held by the wafer holding mechanism 23 of the cleaning apparatus 2 in a substantially horizontal manner. Then, by rotating the wafer holding mechanism 23 around the vertical axis, the wafer W is rotated on a horizontal plane. Then, the nozzle arm 24 is advanced to above the wafer W being rotated, and a SC1 liquid as a chemical liquid for cleaning is supplied onto the central portion of the surface of the wafer W from the first chemical liquid nozzle 25 provided at the leading end of the nozzle arm 24. As the SC1 liquid is diffused by a centrifugal force, the entire surface of the wafer W is covered with a liquid film of the SC1 liquid, so that the surface of the wafer W is cleaned by the SC1 liquid. In this case, a particle or an organic contaminant can be removed from the wafer W. The SC1 liquid on the surface of the wafer W is scattered outwards from a periphery edge We of the wafer W in a radial direction. The scattered SC1 liquid is discharged from the liquid drain ports 221 and 211.

<First Rinsing Process>

After the first chemical liquid cleaning process, a rinsing process is performed on the wafer W while the wafer W is still rotated. In this case, DIW (rinse liquid) is supplied to the central portion of the surface of the wafer W being rotated from the rinse liquid nozzle 27 provided at the leading end of the nozzle arm 24. Accordingly, the DIW is diffused by the centrifugal force and washes the SC1 liquid away from the wafer W. The DIW or the SC1 liquid on the surface of the wafer W is scattered outwards from the periphery edge We of the wafer W in the radial direction and discharged from the liquid drain ports 221 and 211.

<Second Chemical Liquid Cleaning Process>

After the first rinsing process, the wafer W is chemically cleaned with the DHF liquid. In this case, the DHF as the chemical liquid for cleaning is supplied onto the central portion of the surface of the wafer W being rotated from the second chemical liquid nozzle 26 provided at the leading end of the nozzle arm 24. As the DHF is diffused by the centrifugal force, the entire surface of the wafer W is covered with a liquid film of the DHF, so that the surface of the wafer W is cleaned by the DHF. In this case, a natural oxide film formed on the wafer W can be removed. The DHF liquid on the surface of the wafer W is scattered outwards from the periphery edge We of the wafer W in the radial direction and drained from the liquid drain ports 221 and 211.

<Second Rinsing Process>

Figure 8A:
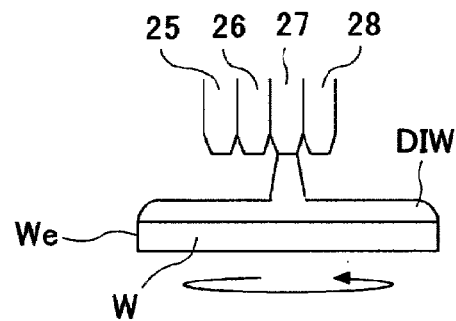
FIG. 8A is a diagram for describing a second rinsing process in a substrate processing method according to the first exemplary embodiment.
Figure 9:
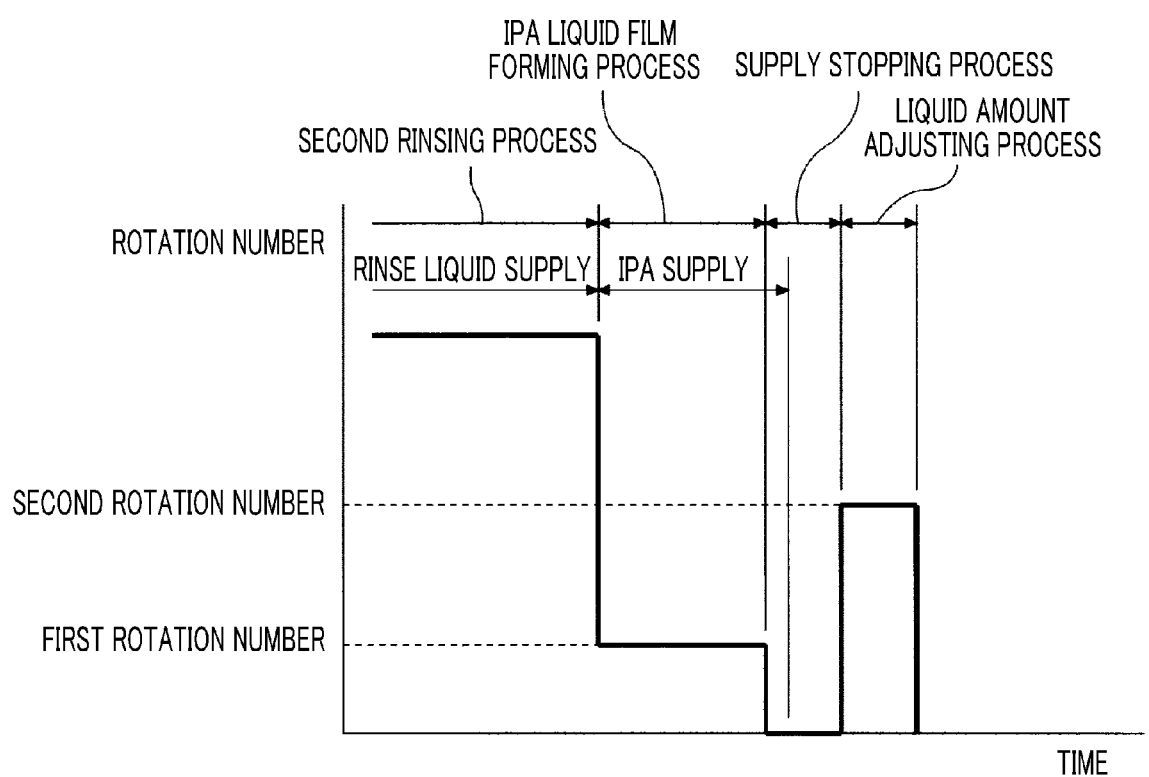
FIG. 9 is a chart showing a change in a rotation number of a substrate in the substrate processing method in FIG. 8A to FIG. 8D.

After the second chemical liquid cleaning process, the wafer W is rinsed as illustrated in FIG. 8A and FIG. 9. In this case, the same as in the first rinsing process, the DIW is supplied to the central portion of the surface of the wafer W being rotated from the rinse liquid nozzle 27 provided at the leading end of the nozzle arm 24. Accordingly, the DIW is diffused by the centrifugal force and washes the DHF away from the wafer W. The DIW and the DHF on the surface of the wafer W is scattered outwards from the periphery edge We of the wafer W in the radial direction and drained from the liquid drain ports 221 and 211.

For example, in the second rinsing process, a discharge amount of the DIW is set to be 300 mL/min, and a rotation number of the wafer W is set to be 1000 rpm. Further, as shown in FIG. 8A, a liquid film of the DIW is formed on the surface of the wafer W.

<IPA Liquid Film Forming Process>

Figure 8B:
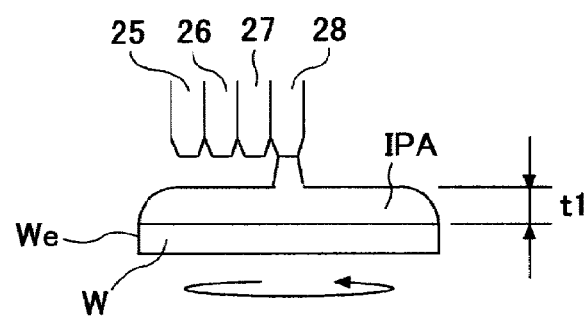
FIG. 8B, a diagram for describing an IPA liquid film forming process.

After the second rinsing process, while rotating the wafer W at a first rotation number, IPA is supplied onto the wafer W as the drying-suppression liquid, as shown in FIG. 8B and FIG. 9. In this case, the rotation number of the wafer W is first reduced to the first rotation number which is lower than the rotation number in the second rinsing process. Then, the IPA opening/closing valve 31 is opened, and the IPA is supplied from the IPA supply source 30 to the IPA nozzle 28 provided at the leading end of the nozzle arm 24 via the IPA supply line 29. The IPA sent to the IPA nozzle 28 is discharged to the central portion of the surface of the wafer W being rotated from the IPA nozzle 28. The IPA is diffused by the centrifugal force, and the liquid film of the DIW formed on a processing target surface of the wafer W is replaced by the IPA, so that a liquid film of the IPA (a puddle of accumulated IPA) covering the surface of the wafer W is formed on the surface of the wafer W, as illustrated in FIG. 8B. The IPA on the surface of the wafer W is scattered outwards from the periphery edge We of the wafer W in the radial direction and drained through the liquid drain ports 221 and 211.

By way of non-limiting example, in the IPA liquid film forming process, the discharge amount of the IPA is set to be 300 mL/min; the rotation number of the wafer W is set to be 30 rpm; and the discharge of the IPA is continued for 15 seconds. The rotation number of the wafer W in the IPA liquid film forming process is set to be smaller than a rotation number of the wafer W in a liquid amount adjusting process to be described later, as depicted in FIG. 9. Therefore, the scattering of the IPA from the periphery edge We of the wafer W is suppressed, so that a thickness (t1 in FIG. 8B) of the liquid film of the IPA after the IPA liquid film forming process is larger than a thickness (t3 in FIG. 8D) of the liquid film of the IPA after the liquid amount adjusting process. That is, a liquid accumulation amount of the IPA after the IPA liquid film forming process is larger than a liquid accumulation amount of the IPA in the liquid amount adjusting process.

<Supply Stopping Process>

Figure 8C:
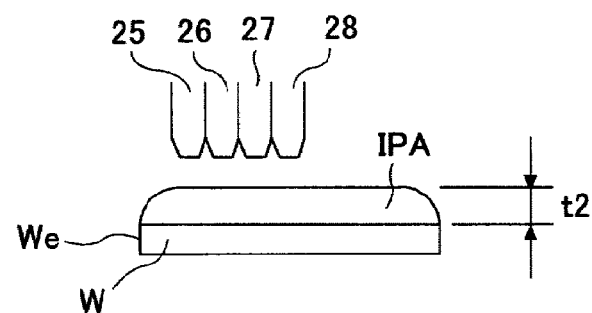
FIG. 8C, a diagram for describing a supply stopping process.

After the IPA liquid film forming process, the rotation number of the wafer W is set to be a value equal to or less than the first rotation number (here, the rotation of the wafer W is stopped), and the supply of the IPA onto the wafer W is stopped, as shown in FIG. 8C and FIG. 9. In this case, the rotation of the wafer W is first stopped. Desirably, the stopping of the rotation of the wafer W is performed gently, so that the IPA remaining on the surface of the wafer W is suppressed from being scattered off the surface of the wafer W. Thereafter, the supply of the IPA is stopped by closing the IPA opening/closing valve 31. Even after this supply stopping process, the liquid film of the IPA having the thickness t2 still exists on the surface of the wafer W, and this thickness t2 of this liquid film is equal to or slightly smaller than the thickness t1 of the liquid film of the IPA after the aforementioned IPA liquid film forming process but is larger than the thickness t3 of the liquid film of the IPA after the liquid amount adjusting process to be described later.

<Liquid Amount Adjusting Process>

Figure 8D:
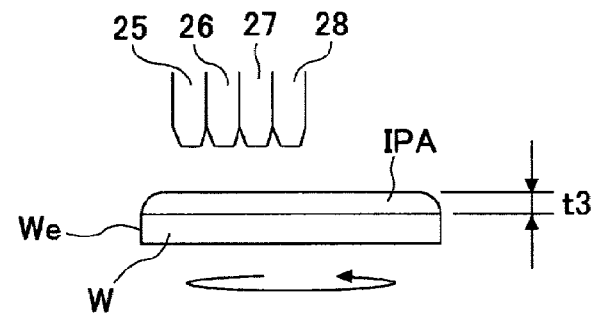
FIG. 8D, a liquid amount adjusting process.

After the supply stopping process, the rotation number of the wafer W is set to a second rotation number larger than the first rotation number, as shown in FIG. 8D and FIG. 9, and the liquid amount of the IPA which forms the liquid film on the surface of the wafer W is reduced. In this case, by rotating the wafer holding mechanism 23 around the vertical axis, the wafer W once stopped is rotated again on the horizontal plane. A part of the IPA forming the liquid film on the surface of the wafer W is scattered outwards from the periphery edge We of the wafer W in the radial direction by a centrifugal force generated by the rotation of the wafer W, and is then drained from the liquid drain ports 221 and 211. In the meanwhile, the IPA opening/closing valve 31 is kept closed, so that the supply of the IPA onto the surface of the wafer W is not performed. Accordingly, the liquid amount of the IPA forming the liquid film is reduced, and the thickness t3 of the liquid film of the IPA becomes smaller than the thickness t1 of the liquid film of the IPA after the IPA liquid film forming process and smaller than the thickness t2 of the liquid film of the IPA after the supply stopping process. As a result, a required thickness of the liquid film of the IPA is achieved.

In the liquid amount adjusting process, it may be appropriate to stop the rotation of the wafer W gently after a lapse of a predetermined time (e.g., 1 sec) after the rotation of the wafer W is resumed (increased). Accordingly, the IPA forming the liquid film can be suppressed from being excessively discharged off the surface of the wafer W, so that the thickness t3 of the liquid film of the IPA can be adjusted to a required value.

In the liquid amount adjusting process, by adjusting the rotation number of the wafer W or the time taken until the rotation of the wafer W is stopped again after being resumed, the thickness of the liquid film of the IPA can be adjusted as required. Further, in order to shorten a processing time of the wafer W, the time taken until the rotation of the wafer W is stopped after it is resumed may be set to be short, and the rotation number of the wafer W may be set such that the thickness of the liquid film of the IPA can be adjusted to a required thickness within this time.

Through the above-described operations, the cleaning processing of the wafer W is completed. At this time, since the liquid film of the IPA having the required thickness is formed on the surface of the wafer W, the wafer W can be suppressed from being dried.

[Drying Processing]

Now, a drying processing for the wafer W in the supercritical processing apparatus 3 will be explained. First, a drying mechanism for the IPA will be explained by using FIG. 10A to FIG. 10D.

<Drying Mechanism>

Figure 10A:
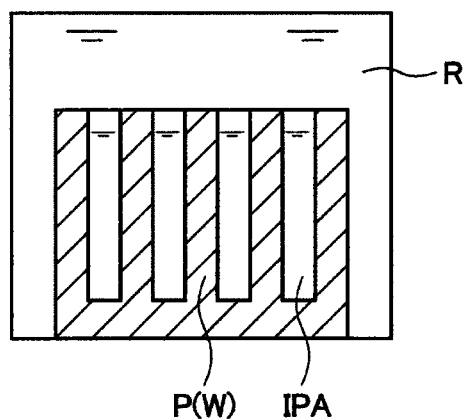
FIG. 10A to FIG. 10D are diagrams for describing a drying mechanism of the IPA, and provide enlarged sectional views schematically illustrating patterns as recesses provided in a wafer.

In the supercritical processing apparatus 3, at the moment when a processing fluid R in a supercritical state is introduced into the vessel main body 311 of the processing vessel 301, it is only the IPA that is filled between patterns P, as illustrated in FIG. 10A.

Figure 10B:
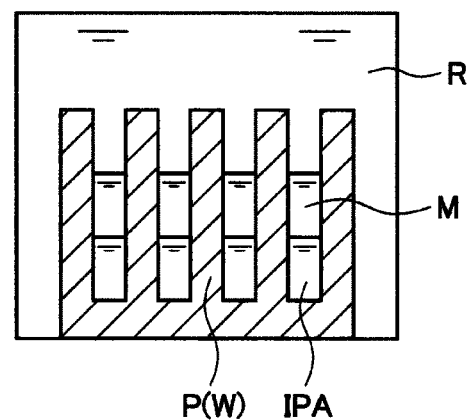

The IPA between the patterns P is gradually dissolved in the processing fluid R as it comes into contact with the processing fluid R in the supercritical state, so that the IPA is slowly replaced by the processing fluid R, as shown in FIG. 10B. At this time, not only the IPA and the processing fluid R but a mixed fluid M of the IPA and the processing fluid R also exists between the patterns P.

Figure 10C:
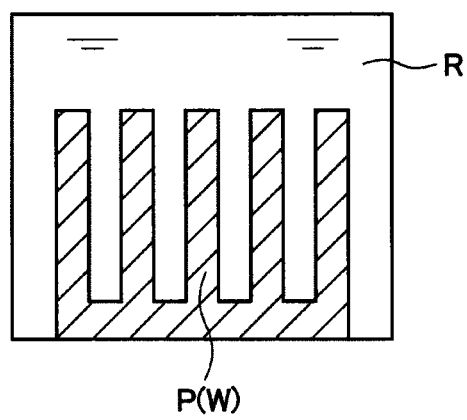

As the replacement from the IPA to the processing fluid R progresses between the patterns P, the IPA is removed from gaps between the patterns P. Finally, as depicted in FIG. 10C, the gaps between the patterns P are filled with only the processing fluid R of the supercritical state.

Figure 10D:
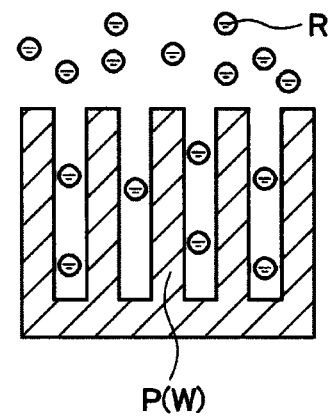

After the IPA is removed from the gaps between the patterns P, by reducing the pressure within the vessel main body 311 to the atmospheric pressure, as depicted in FIG. 10D, the processing fluid R is changed from the supercritical state to a gas state, so that the gaps between the patterns P are occupied only by the gas. In this way, the IPA between the patterns P is removed, and the drying processing upon the wafer W is completed.

Based on the mechanism shown in the above-described FIG. 10A to FIG. 10D, the supercritical processing apparatus 3 according to the exemplary embodiment performs the IPA drying processing as follows.

<Carry-In Process>

After the liquid amount adjusting process, the wafer W with the liquid film of the IPA having the required thickness formed thereon is carried into the processing vessel 301 of the supercritical processing apparatus 3.

In this case, the wafer W is first carried out of the cleaning apparatus 2 and then carried into the processing vessel 301 of the supercritical processing apparatus 3 by the second transfer mechanism 161. When the wafer W is carried into the processing vessel 301, the second transfer mechanism 161 delivers the wafer W onto the holding plate 316 which stands by at a delivery position and then retreats from a position above the holding plate 316.

Then, the holding plate 316 is slid in the horizontal direction to be moved to a processing position within the vessel main body 311. At this time, the first cover member 315 is accommodated in the first cover member accommodation space 324 to close the transfer opening 312. Subsequently, the first cover member 315 is attracted to the vessel main body 311 by a suction force from the vacuum suction pipe 348 (see FIG. 4 and FIG. 5), and the transfer opening 312 is closed by the first cover member 315. Then, the first lock plate 327 is raised to the lock position by the elevating mechanism 326 and brought into contact with a front surface of the first cover member 315, thus restricting the movement of the first cover member 315.

<Drying Process>

After the carry-in process, the wafer W is dried. In the drying process, the pressurized processing fluid is supplied into the processing vessel 301. To elaborate, while supplying the pressurized processing fluid into the processing vessel 301 and maintaining the pressure within the processing vessel 301 at a pressure where the processing fluid is maintained in a critical state, the processing fluid is supplied into the processing vessel 301 and the processing fluid is drained from the processing vessel 301. Accordingly, the IPA on the wafer W is replaced by the processing fluid. Then, by reducing the pressure within the processing vessel 301, the wafer W is dried.

To be more specific, before the IPA accumulated on the surface of the wafer W is dried, by opening the opening/closing valve 67 and the flow rate control valve 69, the processing fluid of a high pressure is supplied into the processing space 319 via the first supply line 63 and the second supply line 64. Accordingly, the pressure within the processing space 319 is raised to, by way of non-limiting example, about 14 MPa to about 16 MPa. Along with this pressurization of the processing space 319, the seal member 339 having the U-shaped cross section provided in the recess 338 of the first cover member 315 is expanded, so that the gap between the first cover member 315 and the vessel main body 311 is hermetically sealed.

Meanwhile, within the processing space 319, if the processing fluid supplied into the processing space 319 comes into contact with the IPA accumulated on the wafer W, the accumulated IPA is gradually dissolved in the processing fluid to be replaced by the processing fluid. As this replacement from the IPA to the processing fluid progresses between the patterns of the wafer W, the IPA is removed from gaps between the patterns. Finally, the gaps between the patterns P are filled only by the processing fluid in the supercritical state. As a result, on the surface of the wafer W, the liquid IPA is gradually replaced by the processing fluid.

At this time, since no interface is formed between the liquid IPA and the processing fluid in the equilibrium state, the IPA on the surface of the wafer W can be replaced by the processing fluid without generating the pattern collapse.

Thereafter, if the IPA on the surface of the wafer W is completely replaced by the processing fluid with a lapse of a preset time after the processing fluid is supplied into the processing space 319, an atmosphere within the processing space 319 is discharged to the outside of the vessel main body 311 from the fluid discharge header 318 by opening the decompression valve 70. Accordingly, the pressure within the vessel main body 311 is gradually reduced, so that the processing fluid within the processing space 319 turns into the gas state from the supercritical state. At this time, since no interface is formed between the supercritical state and the gas, the wafer W can be dried without imposing the surface tension on the patterns formed on the surface of the wafer W.

After the supercritical processing of the wafer W is finished through the above-described process, a purge is performed toward the fluid discharge header 318 by supplying a $N_2$ gas from a non-illustrated purge gas supply line in order to discharge the processing fluid in the gas state left in the processing space 319. Then, if the purge is completed by performing the supply of the $N_2$ gas for a preset time period and the inside of the vessel main body 311 is returned back into the atmospheric pressure, the first lock plate 327 is lowered to the opening position. Then, the holding plate 316 is horizontally moved to the delivery position, and the wafer W obtained after the supercritical processing is carried out by using the second transfer mechanism 161.

While the above-stated supercritical processing is being performed, the second lock plate 337 is kept at the lock position. Accordingly, the second lock plate 337 and a rear surface of the second cover member 322 are in contact with each other, so that a movement of the second cover member 322 is restricted. In case that the high-pressure processing fluid is not supplied in the processing space 319 and the pressure within the vessel main body 311 is not high, the sidewall surfaces of the second cover member 322 and the vessel main body 311 press the seal member 329, directly facing each other, so that the vicinity of the maintenance opening 321 is hermetically sealed.

Meanwhile, in case that the high-pressure processing fluid is supplied in the processing space 319, the second cover member 322 is moved in a direction away from the processing space 319 (in the +Y direction) by the gap C2 between the insertion holes 335 and 333 around the maintenance opening 321 and the second lock plate 337. As the second cover member 322 is moved, the gap between the second cover member 322 and the vessel main body 311 is enlarged. In this case, since the opening 329a is enlarged by a restoration force of the seal member 329 having elasticity, the outer peripheral surface of the seal member 329 is brought into firm contact with the second cover member 322 and the vessel main body 311, so that the gap between the second cover member 322 and the vessel main body 311 is hermetically sealed. In this way, while the above-described supercritical processing is being performed, the second cover member 322 maintains the state in which it closes the maintenance opening 321.

Further, while the high-pressure processing fluid is being supplied into the processing space 319 from the first supply line 63, the processing fluid is supplied into the opening 329a of the seal member 329 through the additional openings 330 provided at the second cover member 322. Accordingly, the processing fluid is jetted to the inside of the seal member 329, so that impurities such as dust adhering to the inner surface of the seal member 329 can be blown away. Therefore, while performing the supercritical processing, the inner surface of the seal member 329 can be made clean. The processing fluid supplied into the opening 329a is introduced into the processing space 319.

[Maintenance Method]

Now, an operation of performing a maintenance of the processing vessel 301 after the completion of the aforementioned supercritical processing will be explained.

First, the inside of the processing space 319 is opened to the atmosphere. Then, the first lock plate 327 is moved downwards from the insertion holes 323 and 325 by the elevating mechanism 326 to be located at the opening position, so that the first cover member 315 is opened. Then, the first cover member 315 and the holding plate 316 are moved forward (−Y direction). Accordingly, the holding plate 316 is taken out of the processing space 319, and the first cover member 315 is spaced apart from the transfer opening 312 (FIG. 11A).

Thereafter, the second lock plate 337 is moved downwards from the insertion holes 333 and 335 to the opening position, so that the second cover member 322 is opened. Then, the second cover member 322 is moved inwards (+Y direction), so that the second cover member 322 is spaced apart from the maintenance opening 321 (FIG. 11B).

Afterwards, a cleaning jig or tool is inserted from the maintenance opening 321, and a maintenance work (cleaning, adjustment, or the like) for the inside of the processing space 319 is performed. In the present exemplary embodiment, since access to the inside of the processing space 319 is enabled just by moving the second lock plate 337 downwards and separating the second cover member 322, such a maintenance work can be carried out easily. Further, since the supply port 313 is connected with the second cover member 322, a maintenance work (cleaning, adjustment, or the like) for the supply port 313 or the openings 332 can be easily performed along with the maintenance work for the inside of the processing space 319.

After the maintenance work is completed as described above, the second cover member 322 and the first cover member 315 are respectively assembled to the vessel main body 311 in the reverse order as stated above. That is, the second cover member 322 is first moved forward (−Y direction), and the maintenance opening 321 is covered with the second cover member 322. Then, the second cover member 322 is attracted toward the vessel main body 311 by the suction force from the vacuum suction pipe 349. Then, the second lock plate 337 is raised to be inserted into the insertion holes 333 and 335 and located at the lock position where the second lock plate 337 presses the second cover member 322. Accordingly, the vicinity of the maintenance opening 321 is hermetically sealed.

Subsequently, by moving the first cover member 315 and the holding plate 316 inwards (+Y direction), the holding plate 316 is advanced into the processing space 319, and the transfer opening 312 is closed by the first cover member 315. Then, the first cover member 315 is attracted toward the vessel main body 311 by the suction force from the vacuum suction pipe 348. Thereafter, the first lock plate 327 is raised by the elevating mechanism 326, and the first lock plate 327 is inserted into the insertion holes 323 and 325 to be located at the lock position. Accordingly, the vicinity of the transfer opening 312 is hermetically closed, so that the processing space 319 is sealed again. Thereafter, the aforementioned supercritical processing is performed when necessary.

According to the present exemplary embodiment as described above, the liquid film of the IPA is formed on the surface of the wafer W while rotating the wafer W at the first rotation number, and, then, the rotation of the wafer W is stopped and the supply of the IPA is stopped. Thereafter, the wafer W is rotated at the second rotation number larger than the first rotation number. Accordingly, the thickness of the liquid film of the IPA can be adjusted by controlling the rotation number of the wafer W, regardless of the timing of stopping the supply of the IPA.

Here, it may also be considered to adjust the thickness of the liquid film of the IPA by maintaining for a preset time period the state in which the IPA is discharged at a required discharge amount (supply amount) while rotating the wafer W at a required rotation number. In this case, after the lapse of the preset time period, the rotation of the wafer W is stopped, and the supply of the IPA is also stopped. The stopping of the rotation of the wafer W is achieved as the control unit 4 outputs a stopping instruction to the motor 20 configured to rotate the wafer holding mechanism 23. Accordingly, a time taken until the rotation of the wafer W is stopped after the control unit 4 outputs the stopping instruction may hardly vary. Meanwhile, the stopping of the supply of the IPA is achieved as the control unit 4 outputs a closing instruction to the IPA opening/closing valve 31. To be more specific, a valve main body driving unit (not shown) of the IPA opening/closing valve 31 that has received the closing instruction from the control unit 4 moves a valve main body, thus rendering an internal path of the IPA opening/closing valve 31 closed. Accordingly, a time taken until the IPA opening/closing valve 31 is closed after the control unit 4 outputs the closing instruction may be easily varied and may be difficult to maintain constant. Therefore, the thickness of the liquid film of the IPA on the surface of the wafer W is varied, so that it may become difficult to maintain the required thickness of the liquid film of the IPA.

In contrast, according to the present exemplary embodiment, after the rotation of the wafer W is stopped and the supply of the IPA is stopped, the wafer W is rotated at the second rotation number which is larger than the rotation number (first rotation number) of the wafer W while the IPA is being supplied onto the wafer W, as described above. Thus, by adjusting the rotation number of the wafer W, the thickness of the liquid film of the IPA can be adjusted, regardless of the stopping of the supply of the IPA. Therefore, the variation of the thickness of the liquid film of the IPA is suppressed, so that accuracy of the thickness can be improved. In this case, the vaporization of the IPA can be suppressed until the wafer W obtained after the cleaning processing is subjected to the drying processing in the supercritical processing apparatus 3. Furthermore, it is also possible to suppress particle generation on the wafer W after the drying processing in the supercritical processing apparatus 3.

In addition, according to the exemplary embodiment, in the supply stopping process of stopping the supply of the IPA onto the surface of the wafer W, the rotation of the wafer W is stopped. Accordingly, in the supply stopping process, the IPA remaining on the surface of the wafer W can be prevented from being discharged off the wafer W by the centrifugal force, so that the liquid film of the IPA on the wafer W can be maintained by the surface tension. Thus, the thickness of the liquid film at the time of the beginning of the liquid amount adjusting process can be secured, and the liquid film of the IPA after the liquid amount adjusting process can be adjusted to the required thickness.

Furthermore, according to the present exemplary embodiment, in the supply stopping process of stopping the supply of the IPA onto the surface of the wafer W, the supply of the IPA is stopped after the rotation of the wafer W is stopped. That is, even if the control unit 4 outputs the stopping instruction to the motor 20 and the closing instruction to the IPA opening/closing valve 31 at the same time, the timing when the IPA opening/closing valve 31 is closed may be later than the timing when the rotation of the wafer W is stopped. In this case, the IPA supplied after the rotation of the wafer W is stopped flows over from the periphery of the wafer W. Accordingly, thickening of the thickness of the liquid film of the IPA can be suppressed at the beginning of the liquid amount adjusting process, so that the liquid film of the IPA after the liquid amount adjusting process can be regulated to have the required thickness.

Moreover, according to the exemplary embodiment, in the liquid amount adjusting process of reducing the liquid amount of the IPA which forms the liquid film, the rotation of the wafer W is stopped after the lapse of the preset time from the time when the rotation number of the wafer W is increased. Accordingly, an excessive discharge of the IPA, which forms the liquid film, from the surface of the wafer W can be suppressed. Therefore, the thickness of the liquid film of the IPA can be suppressed from becoming thinner than the required thickness, so that the accuracy of the thickness of the liquid film of the IPA can be improved.

Additionally, according to the exemplary embodiment, after the liquid amount adjusting process, the wafer W is carried into the processing vessel 301 in which the pressure where the processing fluid maintains the critical state is kept, and the processing fluid of the corresponding pressure is supplied onto the wafer W, and the processing fluid is drained from the processing vessel 301. Accordingly, the IPA forming the liquid film on the wafer W is replaced by the processing fluid, and then, by reducing the pressure within the processing vessel 301 thereafter, the wafer W can be dried. Thus, the particle generation on the wafer W can be suppressed.

Further, the present exemplary embodiment has been described for the example where the rotation of the wafer W is stopped in the supply stopping process. The exemplary embodiment, however, is not limited thereto, and the wafer W may be still rotated at the first rotation number or a rotation number less than the first rotation number. In this case, a time required for the rotation number of the wafer W to reach the second rotation number in the liquid amount adjusting process can be shortened.

Figure 12A:
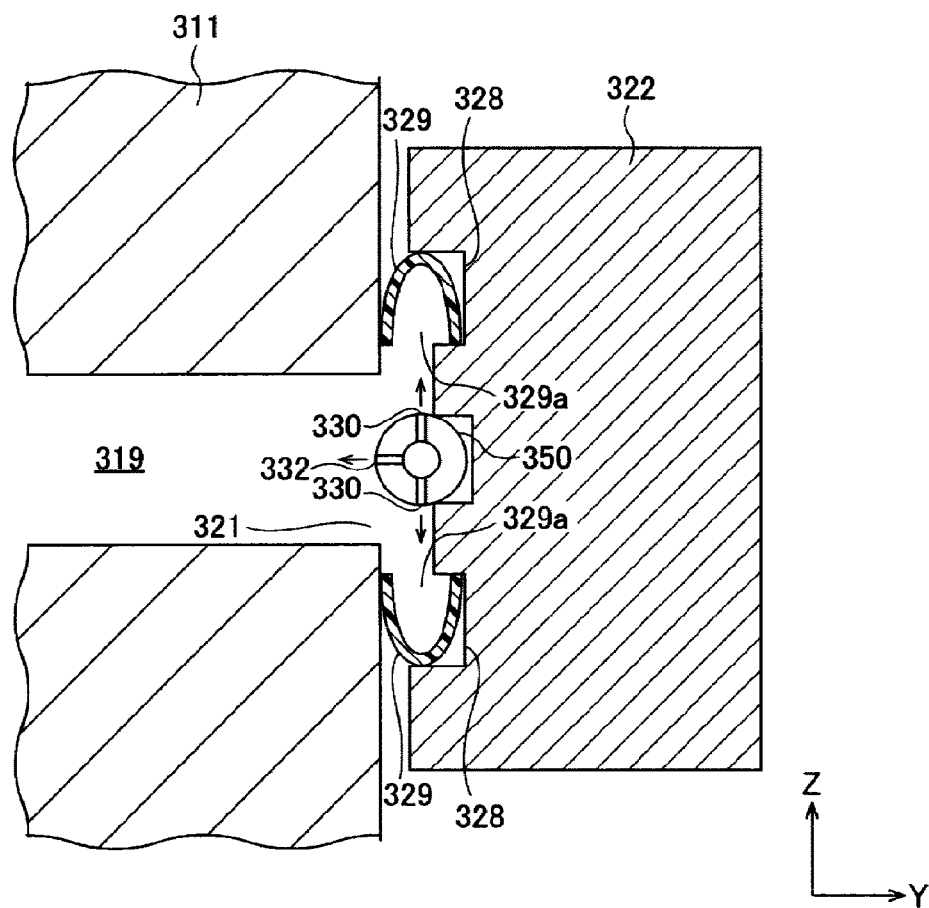
FIG. 12A depicts a modification example of the cross sectional view illustrating the vicinity of the opening for the maintenance of the processing vessel shown in FIG. 5.
Figure 12B:
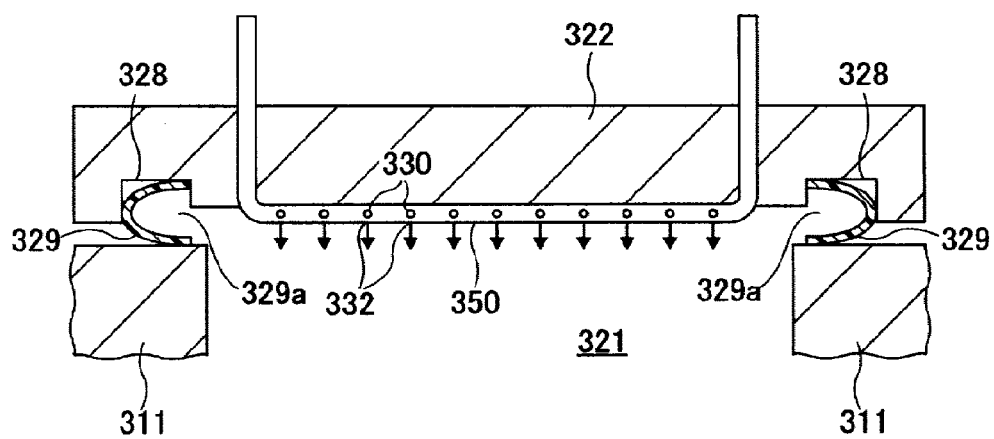
FIG. 12B is a transversal sectional view of a second cover member of FIG. 12A.

Furthermore, the present exemplary embodiment has been described for the example where the second cover member 322 is provided with the multiple number of openings 332 and the multiple number of additional openings 330. However, the exemplary embodiment is not limited thereto. By way of example, a configuration as shown in FIG. 12A and FIG. 12B may be adopted. In the modification example shown in FIG. 12A and FIG. 12B, a fluid supply header 350 having a pipe shape is provided at a surface of the second cover member 322 at the side of the vessel main body 311. On the surface of the second cover member 322 at the side of the vessel main body 311, this fluid supply header 350 is extend in a direction perpendicular to the paper plane (in the X direction shown in FIG. 4). The fluid supply header 350 is connected to the first supply line 63 via the supply port 313. The fluid supply header 350 is provided with the multiple number of openings 332 and the multiple number of additional openings 330. With this configuration, the processing fluid from the first supply line 63 can be supplied into the processing space 319 through the openings 332, and supplied to the inner surface of the seal member 329 through the additional openings 330.

Second Exemplary Embodiment

Now, a substrate processing method, a recording medium and a substrate processing system according to a second exemplary embodiment will be described with reference to FIG. 13A to FIG. 14.

Figure 13A:
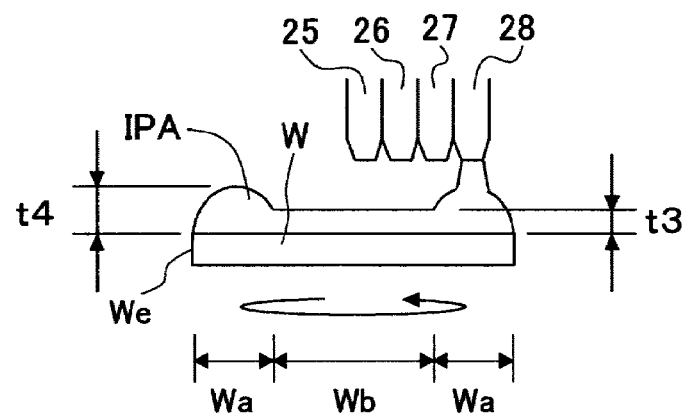
FIG. 13A is a diagram for describing an IPA liquid accumulation process in a substrate processing method according to a second exemplary embodiment.
Figure 13B:
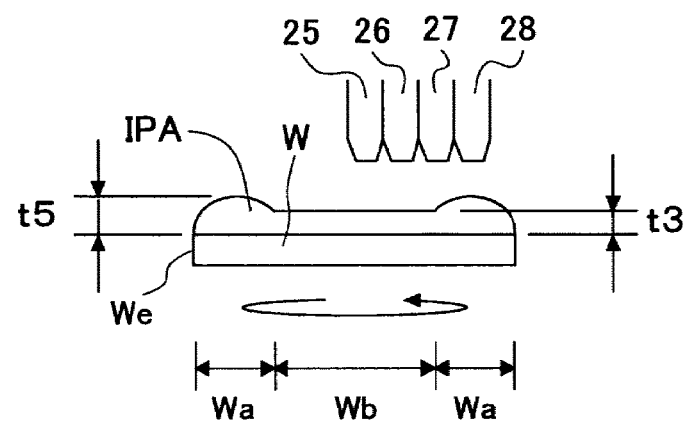
FIG. 13B is a diagram for describing a second liquid amount adjusting process.
Figure 14:
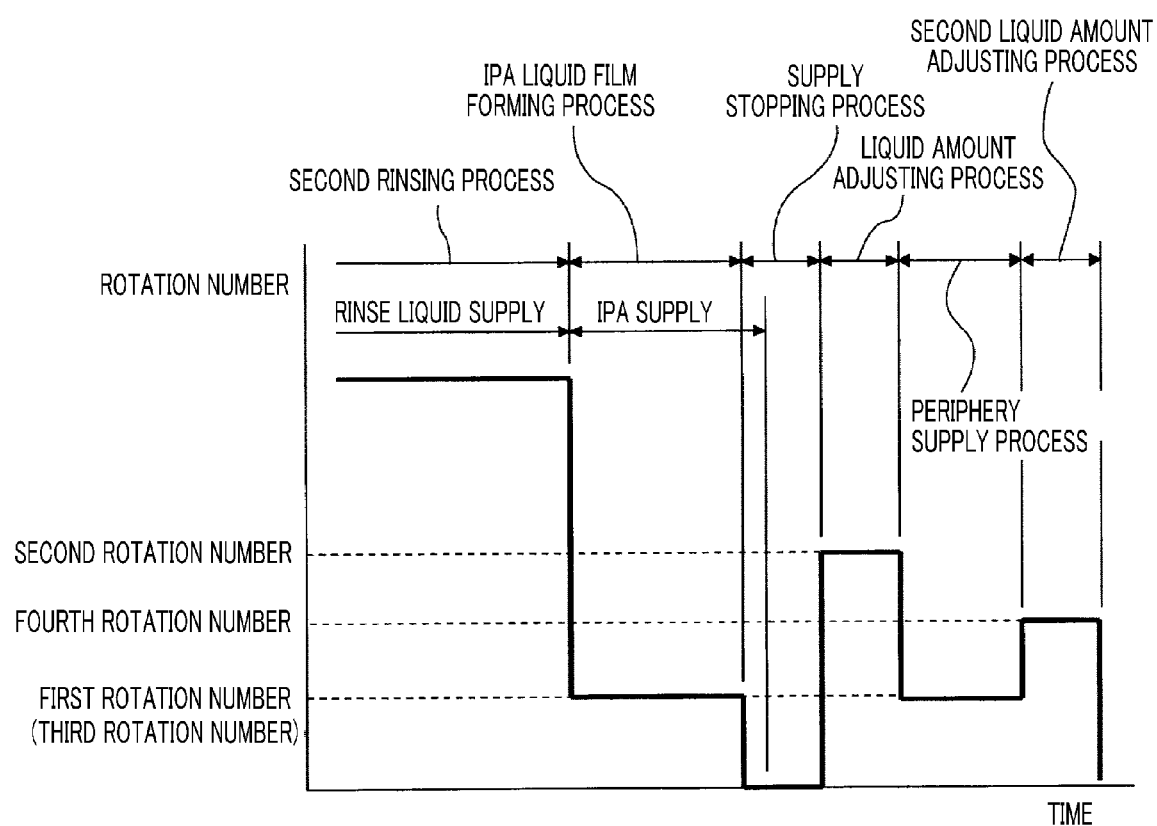
FIG. 14 is a chart showing a change in a rotation number of a substrate in the substrate processing method in FIG. 13A and FIG. 13B.

The second exemplary embodiment shown in FIG. 13A to FIG. 14 is mainly different from the first exemplary embodiment in that a periphery supply process of supplying a processing liquid onto a peripheral portion of the substrate while rotating the substrate and a second liquid amount adjusting process of reducing the liquid amount of the processing liquid which forms the liquid film are additionally included. The other configurations are substantially the same as those of the first exemplary embodiment shown in FIG. 1 to FIG. 12B. In FIG. 13A to FIG. 14, the same parts as those of the first exemplary embodiment shown in FIG. 1 to FIG. 12B will be assigned same reference numerals, and redundant description thereof will be omitted.

In the second exemplary embodiment, the periphery supply process and the second liquid amount adjusting process are performed after the liquid amount adjusting process shown in FIG. 8D. Hereinafter, in a liquid processing method according to the present exemplary embodiment, the periphery supply process and the second liquid amount adjusting process will be elaborated.

<Periphery Supply Process>

After the liquid amount adjusting process, the IPA is supplied onto a peripheral portion Wa of the wafer W while rotating the wafer W at a third rotation number, as shown in FIG. 13A and FIG. 14. In this case, the rotation number of the wafer W is first reduced to the third rotation number lower than the rotation number (second rotation number) in the liquid amount adjusting process. Then, the IPA nozzle 28 is located above the peripheral portion Wa of the wafer W. Thereafter, the IPA opening/closing valve 31 is opened, and the IPA is supplied from the IPA supply source 30 to the IPA nozzle 28. The IPA supplied to the IPA nozzle 28 is supplied onto the peripheral portion Wa of the surface of the wafer W being rotated.

In the periphery supply process, since the wafer W is rotated at the third rotation number at which the liquid accumulation occurs, the IPA supplied onto the peripheral portion Wa stays on the peripheral portion Wa. Accordingly, as illustrated in FIG. 13A, a liquid film of the IPA covering the surface of the wafer W is formed to rise upwards at the peripheral portion Wa. A part of the IPA supplied to the peripheral portion Wa is scattered outwards from the periphery edge We of the wafer W in the radial direction and drained from the liquid drain ports 221 and 211. Here, the peripheral portion Wa refers to a region of the wafer W having a preset width from the periphery edge We thereof. By way of example, in the periphery supply process, a supply point of the IPA onto the wafer W (that is, a position of the IPA nozzle 28) may be set to be 20 mm inward from the periphery edge We of the wafer W. The IPA nozzle 28 can be located at the required supply point by adjusting an advancing position of the nozzle arm 24 shown in FIG. 2.

A discharge amount (supply amount) of the IPA onto the peripheral portion Wa of the wafer W in the periphery supply process may be set to be equal to the discharge amount of the IPA onto the wafer W in the IPA liquid film forming process as shown in FIG. 8B. In the periphery supply process, the discharge amount of the IPA is set to be 300 mL/min; the rotation number of the wafer W is set to be 30 rpm; and the discharge of the IPA is continued for 4 seconds. The rotation number of the wafer W in the periphery supply process (that is, the third rotation number) may be set to be equal to the rotation number of the wafer W in the IPA liquid film forming process (that is, the first rotation number), as depicted in FIG. 14. In this case, the scattering of the IPA from the periphery edge We of the wafer W is suppressed, so that a thickness t4 of the liquid film of the IPA at the peripheral portion Wa of the wafer W becomes larger than a thickness t3 of the liquid film of the IPA at an inner portion Wb of the wafer W located at an inner region than the peripheral portion Wa. Further, the thickness t4 of the liquid film of the IPA at the peripheral portion Wa after the periphery supply process becomes larger than a thickness t5 of the liquid film of the IPA at the peripheral portion Wa after the second liquid amount adjusting process. That is, the liquid accumulation amount of the IPA at the peripheral portion Wa after the periphery supply process is larger than the liquid accumulation amount of the IPA at the peripheral portion Wa after the second liquid amount adjusting process.

<Second Liquid Amount Adjusting Process>

After the periphery supply process, the supply of the IPA onto the wafer W is stopped as shown in FIG. 13B and FIG. 14, and the liquid amount of the IPA forming the liquid film on the surface of the wafer W is reduced while rotating the wafer W. In this case, the IPA opening/closing valve 31 is first closed, so that the supply of the IPA onto the wafer W is stopped. Then, the rotation number of the wafer W is set to a fourth rotation number larger than the third rotation number and equal to or less than the second rotation number. Accordingly, the centrifugal force generated as the wafer W is rotated is increased, so that a part of the IPA accumulated on the peripheral portion Wa of the wafer W is scattered outwards from the periphery edge We of the wafer W in the radial direction and drained from the liquid drain ports 221 and 211. Further, by setting the fourth rotation number to be equal to or less than the second rotation number, the IPA is suppressed from being moved outwards from the inner portion Wb of the wafer W. In the meantime, by keeping the IPA opening/closing valve 31 closed, the supply of the IPA onto the surface of the wafer W is not performed. In this way, while allowing the thickness of the liquid film of the IPA at the inner portion Wb of the wafer W to be maintained at the thickness t3 obtained after the liquid amount adjusting process shown in FIG. 8D, the liquid accumulation amount of the IPA at the peripheral portion Wa is reduced. Accordingly, the thickness t5 of the liquid film of the IPA at the peripheral portion Wa becomes thinner than the thickness t4 of the liquid film of the IPA at the peripheral portion Wa after the periphery supply process. Thus, the thickness of the liquid film of the IPA at the peripheral portion Wa is set to a required thickness, so that the total liquid accumulation amount of the IPA on the surface of the wafer W is adjusted to a required amount.

Further, while the second liquid amount adjusting process is being performed, the liquid film of the IPA maintains the shape where it projects at the peripheral portion Wa of the wafer W due to the centrifugal force by the rotation of the wafer W and the viscosity of the IPA. Further, in case that the total liquid accumulation amount of the IPA after the second liquid amount adjusting process according to the present exemplary embodiment is set to be equal to the total liquid accumulation amount of the IPA after the liquid amount adjusting process of the first exemplary embodiment shown in FIG. 8D, by, for example, increasing the rotation number of the wafer W in the liquid amount adjusting process, which is performed prior to the periphery supply process of the present exemplary embodiment, the liquid accumulation amount of the IPA after the corresponding liquid amount adjusting process needs to be reduced.

In the second liquid amount adjusting process, by adjusting the fourth rotation number or a time taken until the rotation of the wafer W is stopped after being begun to be rotated at the fourth rotation number, the thickness of the liquid film of the IPA at the peripheral portion Wa can be adjusted as required. Further, in order to reduce a processing time of the wafer W, a time taken until the rotation of the wafer is stopped after being resumed may be set to be short (e.g., 1 sec), and the rotation number of the wafer W may be set such that the thickness of the liquid film of the IPA at the peripheral portion Wa can be adjusted to the required thickness within this time period.

Through the above-described processes, the cleaning processing upon the wafer W is completed. At this time, since the liquid film of the IPA having the required thickness (or liquid accumulation amount) is formed on the surface of the wafer W, the wafer W is suppressed from getting dry. Further, this liquid film is formed to rise upwards at the peripheral portion Wa of the wafer W, and, thus, has a shape where the thickness of the liquid film at the peripheral portion Wa is larger than the thickness of the liquid film at the inner portion Wb.

Upon the completion of the cleaning processing of the wafer W, the drying processing is performed in the same manner as in the first exemplary embodiment.

According to the second exemplary embodiment as stated above, the IPA is supplied onto the peripheral portion Wa of the wafer W while rotating the wafer W. Accordingly, the liquid film of the IPA can be formed to project at the peripheral portion Wa of the wafer W.

Here, until the wafer W obtained after the cleaning processing is subjected to the drying processing in the supercritical processing apparatus 3, the IPA at the peripheral portion Wa of the wafer W may be easily vaporized more than the IPA at the inner portion Wb located at the inner region than the peripheral portion Wa. Accordingly, there may be created a state in which the peripheral portion Wa of the wafer W is first dried whereas the IPA still remains on the inner portion Wb. If the peripheral portion Wa of the wafer W is first dried, a so-called pattern collapse may occur at the peripheral portion Wa. To suppress the peripheral portion Wa of the wafer W from being dried, there may be considered a method of increasing the entire thickness of the liquid film of the IPA on the surface of the wafer W. In this method, however, since the liquid accumulation amount of the IPA on the surface of the wafer W is increased, a particle may be easily generated at the surface of the wafer W after the drying processing within the supercritical processing apparatus 3.

In contrast, according to the present exemplary embodiment, the liquid film of the IPA is formed to project at the peripheral portion Wa of the wafer W, as stated above. Therefore, the IPA can be allowed to remain on the peripheral portion Wa of the wafer W for a longer time, so that the phenomenon that the peripheral portion Wa of the wafer W is first dried can be suppressed. As a result, the vaporization of the IPA can be suppressed on the entire surface of the wafer W after the cleaning processing until the drying processing is performed in the supercritical processing apparatus 3. Meanwhile, at the inner portion Wb of the wafer W, the increase of the thickness of the IPA liquid film can be suppressed. Hence, the excessive increase of the liquid accumulation amount of the IPA on the surface of the wafer W can be suppressed, so that the particle generation on the wafer W can be suppressed after the drying processing within the supercritical processing apparatus 3.

Further, according to the present exemplary embodiment, the periphery supply process of supplying the IPA onto the peripheral portion Wa of the wafer W is performed after the liquid amount adjusting process of reducing the liquid amount of the IPA forming the liquid film. Accordingly, the liquid film of the IPA on the surface of the wafer W can be maintained for a long time in the state where it projects at the peripheral portion Wa. Therefore, the vaporization of the IPA can be further suppressed on the entire surface of the wafer W until the drying processing is performed in the supercritical processing apparatus 3.

Moreover, according to the present exemplary embodiment, the second liquid amount adjusting process of reducing the liquid amount of the IPA forming the liquid film on the surface of the wafer W is performed after the periphery supply process of supplying the IPA onto the peripheral portion Wa of the wafer W. Accordingly, the thickness of the liquid film of the IPA on the peripheral portion Wa of the wafer W can be adjusted, and, thus, the accuracy of the thickness can be improved. Therefore, the particle generation on the wafer W can be further suppressed after the drying processing within the supercritical processing apparatus 3.

In addition, according to the present exemplary embodiment, in the second liquid amount adjusting process, the wafer W is rotated at the fourth rotation number which is equal to or less than the rotation number (second rotation number) of the wafer W in the liquid amount adjusting process performed prior to the periphery supply process. Accordingly, the IPA can be suppressed from being moved outwards from the inner portion Wb located at the inner region than the peripheral portion Wa of the wafer W. Therefore, the thickness of the liquid film of the IPA at the inner portion Wb can be maintained at the thickness which is obtained after the corresponding liquid amount adjusting process, so that the accuracy of the thickness of the liquid film can be bettered.

Further, the present exemplary embodiment has been described for the example where the third rotation number of the wafer W in the periphery supply process is equal to the first rotation number of the wafer W in the IPA liquid film forming process. However, the exemplary embodiment is not limited thereto. By way of example, the third rotation number may be larger than or smaller than the first rotation number, as long as the liquid film of the IPA can project at the peripheral portion Wa.

The above second exemplary embodiment has been described for the example where the second liquid amount adjusting process is performed after the periphery supply process. However, the exemplary embodiment is not limited thereto. By way of example, the periphery supply process may be performed after the second rinsing process shown in FIG. 8A and before the IPA liquid film forming process shown in FIG. 8B. In this case as well, the liquid film of the IPA can be formed to project at the peripheral portion Wa of the wafer W, and this shape of the liquid film of the IPA can be maintained even after the second liquid amount adjusting process shown in FIG. 13B.

Furthermore, if the thickness of the liquid film of the IPA at the peripheral portion Wa of the wafer W can be adjust accurately by appropriately adjusting the discharge amount or the discharge time of the IPA supplied to the peripheral portion Wa of the wafer W as well as the rotation number of the wafer W in the periphery supply process, the second liquid amount adjusting process may not be performed. In this case, the discharge amount of the IPA onto the peripheral portion Wa of the wafer W in the periphery supply process may be set to be smaller than the discharge amount of the IPA onto the wafer W in the IPA liquid film forming process shown in FIG. 8B. Further, the discharge time of the IPA onto the peripheral portion Wa of the wafer W may be set to be short (e.g., 2 seconds). By setting the discharge time to be this short, the excessive increase of the thickness of the liquid film of the IPA at the peripheral portion Wa can be suppressed, so that the particle generation on the wafer W can be suppressed after the drying processing within the supercritical processing apparatus 3.

The present disclosure is not limited to the above-described exemplary embodiments themselves and constituent elements can be modified and changed in an embodiment within the scope of the present disclosure. Further, the constituent elements described in the above exemplary embodiments can be combined appropriately to form various inventions. By way of example, some constituent elements may be removed from the constituent elements shown in the exemplary embodiment and the constituent elements in the different exemplary embodiments may be combined appropriately.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A substrate processing method, comprising:
   a liquid film forming process of forming, by supplying a processing liquid onto a surface of a substrate while rotating the substrate at a first rpm (revolutions per minute), a liquid film of the processing liquid covering the surface of the substrate;
   a supply stopping process of stopping after the liquid film forming process, the rotation of the substrate and stopping a supply of the processing liquid onto the substrate;
   a first liquid amount adjusting process of reducing, after the supply stopping process, a liquid amount of the processing liquid forming the liquid film while rotating the substrate at a second rpm larger than the first rpm,
   a periphery supply process of supplying, after the first liquid amount adjusting process, the processing liquid onto a peripheral portion of the substrate while rotating the substrate at a third rpm, the third rpm being equal to the first rpm,
   wherein in the periphery supply process, the processing liquid is supplied by a nozzle located above a peripheral portion of the substrate.

2. The substrate processing method of claim 1,
   wherein, in the supply stopping process, the supply of the processing liquid is stopped after the rotation of the substrate is stopped.

3. The substrate processing method of claim 1, further comprising:
   a second liquid amount adjusting process of stopping, after the periphery supply process, the supply of the processing liquid onto the substrate and reducing the liquid amount of the processing liquid forming the liquid film while rotating the substrate.

4. The substrate processing method of claim 1, further comprising:
   a carry-in process of carrying, after the first liquid amount adjusting process, the substrate with the liquid film of the processing liquid formed thereon into a processing vessel; and
   a drying process of drying, after the carry-in process, the substrate by supplying a pressurized processing fluid into the processing vessel and draining the processing fluid from the processing vessel while supplying the pressurized processing fluid into the processing vessel and maintaining a pressure within the processing vessel at a pressure where the processing fluid maintains a critical state.

5. A computer-readable recording medium having stored thereon computer-executable instructions that, in response to execution, cause a substrate processing system to perform a substrate processing method as claimed in claim 1.

6. The substrate processing method of claim 3,
   wherein, in the second liquid amount adjusting process, the substrate is rotated at a fourth rpm, the fourth rpm having a value equal to or less than the second rpm.

* * * * *